(12) United States Patent
Yada

(10) Patent No.: US 8,519,425 B2
(45) Date of Patent: Aug. 27, 2013

(54) LIGHT-EMITTING DEVICE AND MANUFACTURING METHOD THEREOF

(75) Inventor: Shuhei Yada, Osaka (JP)

(73) Assignee: Panasonic Corporation, Osaka (JP)

( * ) Notice: Subject to any disclaimer, the term of this patent is extended or adjusted under 35 U.S.C. 154(b) by 112 days.

(21) Appl. No.: 13/043,803

(22) Filed: Mar. 9, 2011

(65) Prior Publication Data
US 2011/0204410 A1    Aug. 25, 2011

Related U.S. Application Data

(63) Continuation of application No. PCT/JP2010/001118, filed on Feb. 22, 2010.

(51) Int. Cl.
*H01L 33/00* (2010.01)

(52) U.S. Cl.
USPC ............ 257/99; 257/13; 257/88; 257/40; 257/98; 257/81; 257/60; 257/43; 257/59; 257/72; 438/22; 438/48; 438/128; 438/149; 438/82; 438/283; 438/157; 438/151; 438/99

(58) Field of Classification Search
USPC ........... 257/99, 13, 88, 40, 98, 81, 60, 43, 257/59, 72; 438/22, 48, 128, 149, 151, 157, 438/283, 82, 99
See application file for complete search history.

(56) References Cited

U.S. PATENT DOCUMENTS

| 5,443,922 | A | 8/1995 | Nishizaki et al. | |
| 6,091,078 | A * | 7/2000 | Codama | 257/40 |
| 6,762,552 | B1 * | 7/2004 | Duineveld et al. | 313/506 |
| 6,838,696 | B2 * | 1/2005 | Kobayashi et al. | 257/57 |
| 7,379,145 | B2 * | 5/2008 | Chung | 349/141 |
| 8,067,775 | B2 * | 11/2011 | Miyairi et al. | 257/72 |
| 8,093,585 | B2 * | 1/2012 | Nishimura et al. | 257/40 |
| 8,129,902 | B2 * | 3/2012 | Kai et al. | 313/509 |

(Continued)

FOREIGN PATENT DOCUMENTS

| JP | 5-163488 | 6/1993 |
| JP | 11-054286 | 2/1999 |

(Continued)

OTHER PUBLICATIONS

U.S. Appl. No. 13/088,654 to Takayuki Takeuchi et al., which was filed Apr. 18, 2011.

(Continued)

*Primary Examiner* — Fernando L Toledo
*Assistant Examiner* — Mohammed Shamsuzzaman
(74) *Attorney, Agent, or Firm* — Greenblum & Bernstein, P.L.C.

(57) ABSTRACT

A light-emitting device includes a substrate and a planarizing film above the substrate. The planarizing film has a recessed portion between non-recessed portions. A bottom electrode layer is above the non-recessed portions. A semiconductor interlayer is above the bottom electrode layer. A filling layer is above the recessed portion. The filling layer comprises a same material as the semiconductor layer and has an inner portion between outer portions. A bank is above the recessed portion of the planarizing film and edge portions of the bottom electrode layer, with each of the edge portions of the bottom electrode layer neighboring the recessed portion of the planarizing film. The filling layer inner portion has a thickness of t1, the filling layer outer portions have a thickness of t2, and t1 is greater than t2.

16 Claims, 19 Drawing Sheets

(56) References Cited

U.S. PATENT DOCUMENTS

| | | | |
|---|---|---|---|
| 8,158,988 B2* | 4/2012 | Gambino et al. | 257/81 |
| 8,248,329 B2* | 8/2012 | Yamamoto et al. | 345/76 |
| 8,269,229 B2* | 9/2012 | Suzuki et al. | 257/88 |
| 2004/0113168 A1* | 6/2004 | Eliashevich et al. | 257/99 |
| 2004/0125303 A1* | 7/2004 | Chung | 349/141 |
| 2005/0170076 A1* | 8/2005 | Seki et al. | 427/66 |
| 2006/0086937 A1* | 4/2006 | Fujii et al. | 257/72 |
| 2006/0273718 A1* | 12/2006 | Wang et al. | 313/512 |
| 2007/0063639 A1* | 3/2007 | Hamano et al. | 313/504 |
| 2007/0241665 A1* | 10/2007 | Sakanoue et al. | 313/503 |
| 2007/0242004 A1* | 10/2007 | Oooka et al. | 345/76 |
| 2008/0231770 A1* | 9/2008 | Kobayashi et al. | 349/39 |
| 2008/0246049 A1* | 10/2008 | Saito et al. | 257/99 |
| 2008/0290789 A1* | 11/2008 | Kai et al. | 313/504 |
| 2009/0122822 A1* | 5/2009 | Murayama | 372/43.01 |
| 2010/0051975 A1* | 3/2010 | Suzuki et al. | 257/89 |
| 2010/0084650 A1* | 4/2010 | Yamazaki et al. | 257/43 |
| 2010/0244029 A1* | 9/2010 | Yamazaki et al. | 257/52 |
| 2010/0264447 A1* | 10/2010 | Niki et al. | 257/98 |
| 2010/0320481 A1* | 12/2010 | Kashiwabara | 257/88 |
| 2011/0018007 A1* | 1/2011 | Kasahara et al. | 257/88 |
| 2011/0031499 A1* | 2/2011 | Kimura et al. | 257/59 |
| 2011/0068334 A1* | 3/2011 | Yamazaki et al. | 257/43 |
| 2011/0084268 A1* | 4/2011 | Yamazaki et al. | 257/43 |
| 2011/0108877 A1* | 5/2011 | Yamada et al. | 257/99 |
| 2011/0109351 A1* | 5/2011 | Yamazaki et al. | 327/109 |
| 2011/0147739 A1* | 6/2011 | Yamazaki et al. | 257/43 |
| 2011/0186903 A1* | 8/2011 | Nakanishi | 257/99 |
| 2011/0198564 A1* | 8/2011 | Son | 257/13 |
| 2011/0215331 A1* | 9/2011 | Yamazaki et al. | 257/60 |
| 2011/0227100 A1* | 9/2011 | Kurihara et al. | 257/88 |
| 2011/0291128 A1* | 12/2011 | Harada et al. | 257/88 |
| 2012/0049175 A1* | 3/2012 | Ono et al. | 257/40 |

FOREIGN PATENT DOCUMENTS

| | | |
|---|---|---|
| JP | 2004-192890 | 7/2004 |
| JP | 2005-011572 | 1/2005 |
| JP | 2007-220393 | 8/2007 |
| JP | 2007-287346 | 11/2007 |
| JP | 2008-059868 | 3/2008 |
| JP | 2008-089634 | 4/2008 |

OTHER PUBLICATIONS

International Search Report in PCT/JP2010/001118, dated Apr. 6, 2010.

* cited by examiner

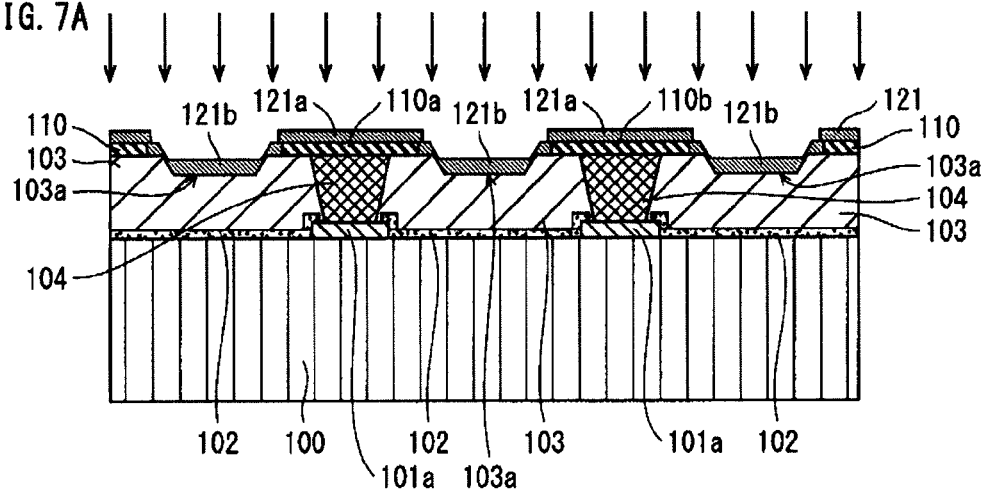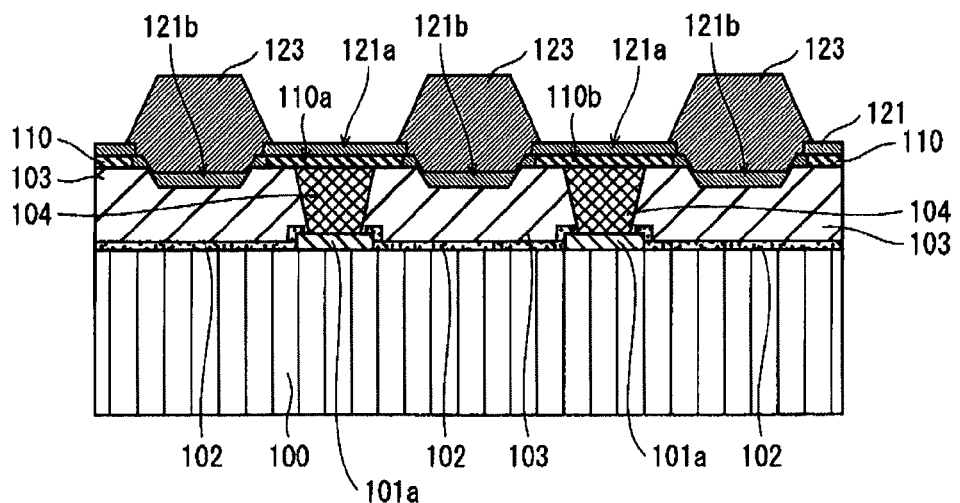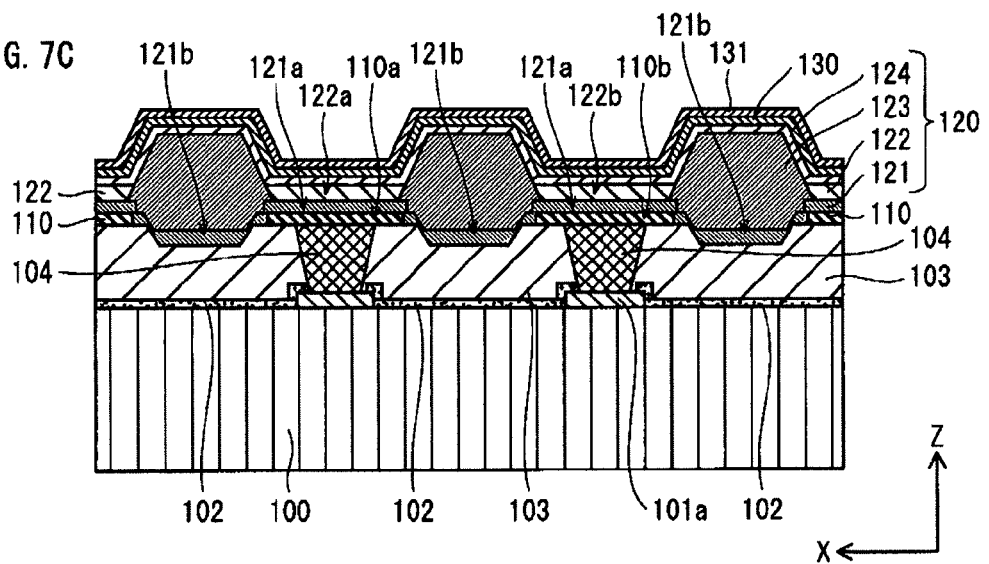

LIGHT-EMITTING DEVICE AND MANUFACTURING METHOD THEREOF

CROSS REFERENCE TO RELATED APPLICATION

This is a continuation application of PCT Application No. PCT/JP2010/001118, filed on Feb. 22, 2010, designating the United States of America, the disclosure of which, including the specification, drawings and claims, is incorporated herein by reference in its entirety.

BACKGROUND OF THE INVENTION

1. Field of the Invention

The present invention relates to a light-emitting device and a manufacturing method thereof.

2. Description of the Related Art

In recent years, research and development of organic electroluminescence (EL) display devices have been carried out (see, e.g., Patent Literature 1 and 2). Such organic EL display devices have structures in which an organic EL element is provided for each sub-pixel, and the organic EL element emits light by itself by utilizing a phenomenon known as electroluminescence occurring in solid-state fluorescent materials. The following describes the structure of an organic EL display device relating to conventional technology with use of FIG. 19.

As shown in FIG. 19, the organic EL display device relating to conventional technology has the structure in which a TFT (Thin Film Transistor) layer (in FIG. 19, only sources 901a, parts of the TFT layer, are illustrated), a passivation film 902, and a planarizing film 903 are formed on a substrate 900 in the stated order. Furthermore, an anode layer 910 is formed on the planarizing film 903 for each sub-pixel. The bottom electrode layer (i.e. the anode layer) 910 has a laminated structure in which a metal layer 9101 and a transparent conductive layer 9102 are laminated. The bottom electrode layer 910 is connected to the source 901a of the TFT layer via a contact hole 904.

Since the bottom electrode layer 910 is provided for each sub-pixel, in FIG. 19, a first bottom electrode layer 910a and a second bottom electrode layer 910b that are respectively provided for two adjacent sub-pixels are illustrated. In other words, in the two adjacent sub-pixels, (i) the first bottom electrode layer 910a composed of a first metal layer 9101a and a first transparent conductive layer 9102a and (ii) the second bottom electrode layer 910b composed of a second metal layer 9101b and a second transparent conductive layer 9102b are electrically isolated from each other.

Then, a light-emitting layered body 920, a top electrode layer (i.e. a cathode layer) 930, and a passivation layer 931 are laminated in the stated order on the bottom electrode layer 910 and parts of the planarizing film 903 positioned between adjacent sub-pixels. The light-emitting layered body 920 is composed of a semiconductor interlayer 921, a light-emitting layer 922, and an electron-injection layer 924 that are laminated on a surface of the planarizing film 903 in the stated order, and a bank 923. The bank 923 divides the light-emitting layer 922 into parts for respective sub-pixels. Specifically, a light-emitting layer 922a above the first bottom electrode layer 910a and a light-emitting layer 922b above the second bottom electrode layer 910b are separated from each other by the bank 923.

3. Citation List

[Patent Literature 1] Japanese Patent Application Publication No. H11-54286

[Patent Literature 2] Japanese Patent Application Publication No. 2004-192890

SUMMARY OF THE INVENTION

As indicated by an arrow D in FIG. 19, however, since the semiconductor interlayer 921 is formed on an entire surface of a panel in the organic EL display device relating to conventional technology, leak current flows between the bottom electrode layers 910 for adjacent sub-pixels (e.g. the first bottom electrode layer 910a and the second bottom electrode layer 910b), resulting in occurrence of crosstalk.

In FIG. 19, although the organic EL display device is taken as an example of conventional technology, the similar problem exists in a light-emitting device including such an organic EL display device as well.

The present invention has been achieved in view of the above problem, and aims to provide (i) a light-emitting device capable of suppressing leak current flowing between the adjacent bottom electrode layers and effectively preventing the occurrence of crosstalk, and (ii) a manufacturing method of the light-emitting device.

In order to solve the above problems, a light-emitting device pertaining to one aspect of the present invention adopts the following structure.

One aspect of the present invention is a light-emitting device comprising: a planarizing film that is located above a substrate and has a recessed portion; a first bottom electrode layer located on a non-recessed portion of the planarizing film; a second bottom electrode layer located on another non-recessed portion of the planarizing film, so that the recessed portion is located between the first and second bottom electrode layers; a semiconductor interlayer located above each of the first and second bottom electrode layers; and a bank that covers the recessed portion and edge portions of the first and second bottom electrode layers, the edge portions neighboring the recessed portion, wherein a surface of the planarizing film is lower in the recessed portion than in the non-recessed portions, a filling layer is formed on the surface of the planarizing film in the recessed portion, the filling layer and the semiconductor interlayer being made of the same material, and the filling layer is thinner at edge portions than at a middle portion thereof.

In the light-emitting device pertaining to one aspect of the present invention, the planarizing film has the recessed portion in an area between the first and second bottom electrode layers. The surface of the planarizing film is lower in the recessed portion than in the non-recessed portions, and the filling layer made of the same material as the semiconductor interlayer is formed on the surface of the planarizing film in the recessed portion. The filling layer is thinner at the edge portions than at the middle portion thereof.

In the light-emitting device pertaining to one aspect of the present invention, with the above-mentioned thickness of the filling layer, the filling layer has low electrical conductivity at the edge portions thereof. Accordingly, in the light-emitting device pertaining to one aspect of the present invention, the first and second bottom electrode layers are not substantially electrically connected with each other by the filling layer. Therefore, the leak current is prevented from flowing between the first and second bottom electrode layers.

Accordingly, the light-emitting device pertaining to one aspect of the prevent invention can effectively prevent the occurrence of crosstalk.

BRIEF DESCRIPTION OF THE DRAWINGS

FIGS. 7A, 7B, and 7C are schematic end views showing a process of manufacturing the display panel 10.

DESCRIPTION OF THE PREFERRED EMBODIMENT(S)

Figure 1:
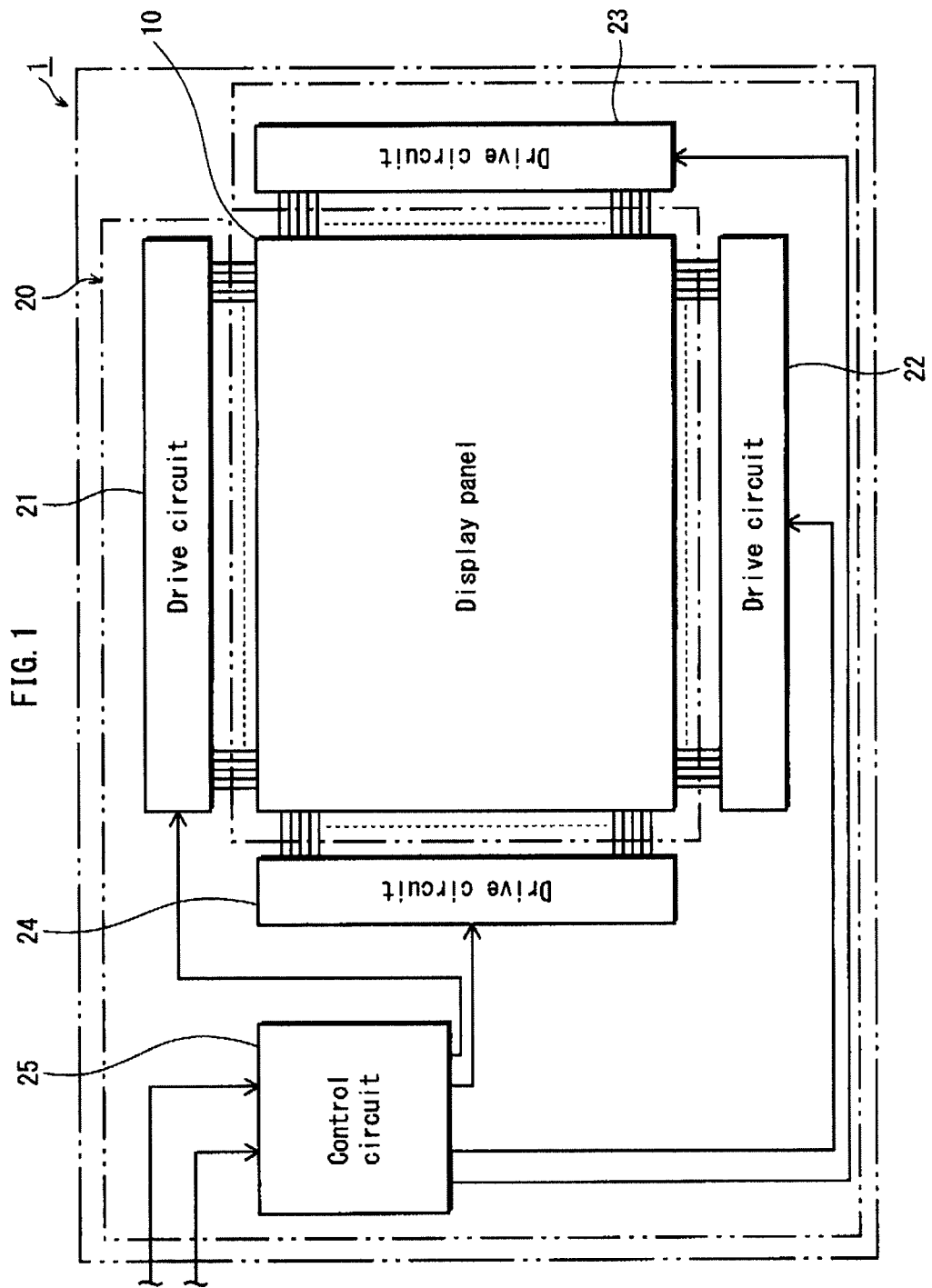
FIG. 1 is a schematic block diagram showing an overall structure of an organic EL display device 1 pertaining to Embodiment 1.

One aspect of the present invention is a light-emitting device comprising: a planarizing film that is located above a substrate and has a recessed portion; a first bottom electrode layer located on a non-recessed portion of the planarizing film; a second bottom electrode layer located on another non-recessed portion of the planarizing film, so that the recessed portion is located between the first and second bottom electrode layers; a semiconductor interlayer located above each of the first and second bottom electrode layers; and a bank that covers the recessed portion and edge portions of the first and second bottom electrode layers, the edge portions neighboring the recessed portion, wherein a surface of the planarizing film is lower in the recessed portion than in the non-recessed portions, a filling layer is formed on the surface of the planarizing film in the recessed portion, the filling layer and the semiconductor interlayer being made of the same material, and the filling layer is thinner at edge portions than at a middle portion thereof.

In the light-emitting device pertaining to one aspect of the present invention, the planarizing film has the recessed portion in an area between the first and second bottom electrode layers. The surface of the planarizing film is lower in the recessed portion than in the non-recessed portions, and the filling layer made of the same material as the semiconductor interlayer is formed on the surface of the planarizing film in the recessed portion. The filling layer is thinner at the edge portions than at the middle portion thereof.

In the light-emitting device pertaining to one aspect of the present invention, with the above-mentioned thickness of the filling layer, the filling layer has low electrical conductivity at the edge portions thereof. Accordingly, in the light-emitting device pertaining to one aspect of the present invention, the first and second bottom electrode layers are not substantially electrically connected with each other by the filling layer. Therefore, the leak current is prevented from flowing between the first and second bottom electrode layers.

Accordingly, the light-emitting device pertaining to one aspect of the prevent invention can effectively prevent the occurrence of crosstalk.

Another aspect of the present invention is a light-emitting device comprising: a planarizing film that is located above a substrate and has a recessed portion; a first bottom electrode layer located on a non-recessed portion of the planarizing film; a second bottom electrode layer located on another non-recessed portion of the planarizing film, so that the recessed portion is located between the first and second bottom electrode layers; a semiconductor interlayer located above each of the first and second bottom electrode layers; and a bank that covers the recessed portion and edge portions of the first and second bottom electrode layers, the edge portions neighboring the recessed portion, wherein a surface of the planarizing film is lower in the recessed portion than in the non-recessed portions, a filling layer is formed on the surface of the planarizing film in the recessed portion, the filling layer and the semiconductor interlayer being made of the same material, the surface of the planarizing film in the recessed portion includes side sub-surfaces, on parts of which the filling layer is not formed, and the filling layer and the semiconductor interlayer are separated from each other by the parts of the side sub-surfaces on which the filling layer is not formed.

In the light-emitting device pertaining to the other aspect of the present invention, the planarizing film has the recessed portion in an area between the first and second bottom electrode layers. The surface of the planarizing film is lower in the recessed portion than in the non-recessed portions, and the filling layer made of the same material as the semiconductor interlayer is formed on the surface of the planarizing film in the recessed portion. Furthermore, the surface of the planarizing film in the recessed portion includes the side sub-surfaces, on parts of which the filling layer is not formed.

In the light-emitting device pertaining to the other aspect of the present invention, by the surface of the planarizing film in the recessed portion including the side sub-surfaces, on parts of which the filling layer is not formed, the filling layer and the semiconductor interlayer are separated from each other by the parts of the side sub-surfaces on which the filling layer is not formed. Therefore, the semiconductor interlayer is not continuously formed across the first and second bottom electrode layers beyond the recessed portion.

Therefore, since the first and second bottom electrode layers are not electrically connected with each other by the semiconductor interlayer, the leak current is prevented from flowing between the first and second bottom electrode layers.

Accordingly, the light-emitting device pertaining to the other aspect of the prevent invention can prevent the occurrence of crosstalk.

Furthermore, in the light-emitting device pertaining to the other aspect of the present invention, the bank is formed to be embedded in the recessed portion in the direction of a sub-pixel area. With this structure, adhesion of the bank to the planarizing film is improved. As a result, the bank becomes difficult to be detached, thus the light-emitting device pertaining to the other aspect of the present invention is highly reliable.

Another aspect of the present invention is the light-emitting device, wherein a verge of an opening of the recessed portion is under the first and second bottom electrode layers.

In the light-emitting device pertaining to the other aspect of the present invention, as described above, the verge of the opening of the recessed portion is under the first and second bottom electrode layers. With this structure, the surface of the planarizing film in the recessed portion includes the side sub-surfaces, on parts of which the semiconductor interlayer is not formed.

Therefore, in the light-emitting device pertaining to the other aspect of the present invention, since there is no physical medium that electrically connects the first and second bottom electrode layers in upper edge portions of the side sub-surfaces, the leak current is completely prevented from flowing between the first and second bottom electrode layers.

Accordingly, the light-emitting device pertaining to the other aspect of the prevent invention can prevent the occurrence of crosstalk.

Another aspect of the present invention is the light-emitting device, wherein the first bottom electrode layer includes a first transparent conductive layer at a side close to the semiconductor interlayer, the second bottom electrode layer includes a second transparent conductive layer at a side close to the semiconductor interlayer, and the semiconductor interlayer is located on the first and second transparent conductive layers.

In the light-emitting device pertaining to the other aspect of the present invention, as described above, the first bottom electrode layer may include the first transparent conductive layer at a side close to the semiconductor interlayer, and the second bottom electrode layer may include the second transparent conductive layer at a side close to the semiconductor interlayer.

Another aspect of the present invention is the light-emitting device, wherein a TFT layer is located between the substrate and the planarizing film, and the planarizing film is located on the TFT layer.

In the light-emitting device pertaining to the other aspect of the present invention, as described above, the TFT layer is located between the substrate and the planarizing film, and the planarizing film is located on the TFT film. In this structure, the surface of the planarizing film is lower in the recessed portion than in the non-recessed portions. Therefore, the planarizing film on the TFT layer can be thicker than the planarizing film formed between the first and second bottom electrode layers.

With this structure, since a distance can be maintained between the TFT layer and the first or second bottom electrode layers, an increase in parasitic capacitance formed between the TFT layer and the first or second bottom electrode layers can be prevented.

Accordingly, in the light-emitting device pertaining to the other aspect of the present invention, the occurrence of signal delay and power consumption are reduced.

Another aspect of the present invention is the light-emitting device further comprising: a first light-emitting layer located above the first bottom electrode layer and on the semiconductor interlayer; and a second light-emitting layer located above the second bottom electrode layer and on the semiconductor interlayer, wherein the first and second light-emitting layers are separated from each other by the bank.

In the light-emitting device pertaining to the other aspect of the present invention, as described above, the bank separates (i) the first light-emitting layer located above the first bottom electrode layer and on the semiconductor interlayer and (ii) the second light-emitting layer located above the second bottom electrode layer and on the semiconductor interlayer.

With this structure, since the first and second light-emitting layers are separated from each other, light emitted from the first light-emitting layer and light emitted from the second light-emitting layer are not mixed with each other.

Accordingly, the light-emitting device pertaining to the other aspect of the present invention exhibits outstanding light emission characteristics.

In this structure, the light-emitting device pertaining to another aspect of the present invention comprises a top electrode layer located above the first and second light-emitting layers.

The other aspect of the present invention is the light-emitting device further comprising a top electrode layer located above the first and second light-emitting layers.

Furthermore, another aspect of the present invention is the light-emitting device, wherein the top electrode layer is a cathode layer.

The light-emitting device pertaining to the other aspect of the present invention may have a structure in which the top electrode layer is the cathode layer.

Another aspect of the present invention is the light-emitting device, wherein the first and second bottom electrode layers are anode layers, and the semiconductor interlayer is a hole-injection layer.

In the light-emitting device pertaining to the other aspect of the present invention, the semiconductor interlayer is the hole-injection layer. In the light-emitting device having a structure in which the semiconductor interlayer is the hole-injection layer, injection of holes from the first bottom electrode layer to the first light-emitting layer and injection of holes from the second bottom electrode layer to second light-emitting layer are encouraged.

Accordingly, the light-emitting device pertaining to the other aspect of the present invention can be driven at low voltage, and can lower power consumption.

Another aspect of the present invention is the light-emitting device, wherein a shortest distance between (i) a lowest point on the surface of the planarizing film in the recessed portion and (ii) a point on an imaginary surface that coincides with the surface of the planarizing film in the non-recessed portions is greater than a thickness of the middle portion of the filling layer.

In the light-emitting device pertaining to the other aspect of the present invention, as described above, the shortest distance between (i) the lowest point on the surface of the planarizing film in the recessed portion and (ii) the point on the imaginary surface that coincides with the surface of the planarizing film in the non-recessed portions is greater than the thickness of the middle portion of the filling layer formed on the surface of the planarizing film in the recessed portion. In other words, in the light-emitting device pertaining to the other aspect of the present invention, while the surface of the planarizing film in the recessed portion includes the side sub-surfaces, on parts of which the semiconductor interlayer is not formed because the parts are below the first and second bottom electrode layers, the widths of the parts are increased. As a result, the filling layer can be easily made thinner at the edge portions than at the middle portion thereof.

Alternatively, the widths of the parts of the side sub-surfaces on which the semiconductor interlayer is not formed are increased. Therefore, even when the semiconductor interlayer and the filling layer are made thicker, the semiconductor interlayer on the first bottom electrode layer and the semiconductor interlayer on the second bottom electrode layer are separated from each other more easily. The semiconductor interlayer is not formed across the first and second bottom electrode layers beyond the recessed portion of the planarizing film.

Therefore, since the semiconductor interlayer does not electrically connect the first and second bottom electrode layers, the leak current is prevented from flowing between the first and second bottom electrode layers.

Accordingly, in the light-emitting device pertaining to the other aspect of the present invention, the occurrence of the crosstalk attributable to the leak current is further prevented between adjacent sub-pixels.

Another aspect of the present invention is a manufacturing method of a light-emitting device, comprising: a first step of preparing a substrate; a second step of forming a planarizing film above the substrate; a third step of forming a first bottom electrode layer and a second bottom electrode layer respectively on first and second portions of the planarizing film; a fourth step of forming resists on the first and second bottom electrode layers; a fifth step of etching the planarizing film in an area between the first and second portions to form a recessed portion between the first and second portions, so that a surface of the planarizing film is lower in the recessed portion than in the first and second portions; and a sixth step of forming a semiconductor interlayer on the first and second bottom electrode layers and on the surface of the planarizing film in the recessed portion, wherein the semiconductor interlayer is formed on the surface of the planarizing film in the recessed portion such that the semiconductor interlayer is thinner at edge portions than at a middle portion thereof.

In the manufacturing method of the light-emitting device pertaining to the other aspect of the present invention, the recessed portion is formed in the planarizing film in an area between the first and second bottom electrode layers, and a surface of the planarizing film is lower in the recessed portion than in the first and second portions. On the surface of the planarizing film in the recessed portion, the semiconductor interlayer is formed. The semiconductor interlayer formed on the surface of the planarizing film in the recessed portion is made thinner at the edge portions than at the middle portion thereof, because the semiconductor interlayer is interrupted by the shadowing effect obtained in the side sub-surfaces included in the surface of the planarizing film in the recessed portion when the semiconductor interlayer is formed.

With this structure, in the manufacturing method of the light-emitting device pertaining to the other aspect of the present invention, the semiconductor interlayer formed on the surface of the planarizing film in the recessed portion has low electrical conductivity at the edge portions thereof. Therefore, since the semiconductor interlayer formed on the surface of the planarizing film in the recessed portion substantially prevents the first and second bottom electrode layers from being electrically connected with each other, the leak current is prevented from flowing between the first and second bottom electrode layers.

Therefore, by the manufacturing method of the light-emitting device pertaining to the other aspect of the present invention, the light-emitting device that does not cause the crosstalk can be realized.

Another aspect of the present invention is a manufacturing method of a light-emitting device, comprising: a first step of preparing a substrate; a second step of forming a planarizing film above the substrate; a third step of forming a first bottom electrode layer and a second bottom electrode layer respectively on first and second portions of the planarizing film; a fourth step of etching the planarizing film by using the first and second bottom electrode layers as masks to form a recessed portion between the first and second portions, so that a surface of the planarizing film is lower in the recessed portion than in the first and second portions; and a fifth step of forming a semiconductor interlayer on the first and second bottom electrode layers and on the surface of the planarizing film in the recessed portion, wherein the surface of the planarizing film in the recessed portion includes side sub-surfaces, on parts of which the semiconductor interlayer is not formed, and the semiconductor interlayer is separated by the parts of the side sub-surfaces on which the semiconductor interlayer is not formed.

In the manufacturing method of the light-emitting device pertaining to the other aspect of the present invention, the recessed portion is formed in the fourth step of etching the planarizing film in the area between the first and second bottom electrode layers, and the surface of the planarizing film is lower in the recessed portion than in the first and second portions. Since the surface of the planarizing film in the recessed portion includes the side sub-surfaces, on parts of which the semiconductor interlayer is not formed, the semiconductor interlayer above the first bottom electrode layer and the semiconductor interlayer above the second bottom electrode layer are separated from each other by the parts.

In the manufacturing method of the light-emitting device pertaining to the other aspect of the present invention, the semiconductor interlayer above the first bottom electrode layer and the semiconductor interlayer above the second bottom electrode layer are separated from each other by the parts of the side sub-surfaces on which the semiconductor interlayer is not formed. Therefore, the semiconductor interlayer is not continuously formed across the first and second bottom electrode layers beyond the recessed portion.

Since the planarizing film has the recessed portion, and the surface of the planarizing film is lower in the recessed portion than in the first and second portions, residues of a metal film for forming an electrode layer that exist after the third step of forming the first and second bottom electrode layers can be completely removed. Therefore, the leak current is prevented from flowing between the first and second bottom electrode layers.

Accordingly, by the manufacturing method of the light-emitting device pertaining to the other aspect of the present invention, the light-emitting device that does not cause short circuit between the first and second bottom electrode layers in the adjacent sub-pixels and the crosstalk attributable to the leak current flowing through the semiconductor interlayer can be manufactured.

In the manufacturing method of the light-emitting device pertaining to the other aspect of the present invention, since the bank is formed to be embedded in the recessed portion in the direction of a sub-pixel area, adhesion of the bank to the planarizing film can be improved. As a result, by the manufacturing method of the light-emitting device pertaining to the other aspect of the present invention, the highly reliable light-emitting device having a structure in which the bank is difficult to be detached can be manufactured.

Another aspect of the present invention is the manufacturing method of the light-emitting device, wherein in the fourth step, the planarizing film is etched such that a verge of an opening of the recessed portion is under the first and second bottom electrode layers.

In the manufacturing method of the light-emitting device pertaining to the present invention, as described above, since the recessed portion of the planarizing film having a structure in which the verge of the opening thereof is under the first and second bottom electrode layers is formed in the fourth step, the surface of the planarizing film in the recessed portion can include the side sub-surfaces, on parts of which the semiconductor interlayer is not formed.

Therefore, in the manufacturing method of the light-emitting device pertaining to the other aspect of the present invention, since there is no physical medium that electrically connects the first and second bottom electrode layers in upper edge portions of the side sub-surfaces included in the surface of the planarizing film in the recessed portion, the leak current is prevented from flowing between the first and second bottom electrode layers.

Accordingly, by the manufacturing method of the light-emitting device pertaining to the other aspect of the present invention, the light-emitting device that does not cause the crosstalk can be realized.

The other aspect of the present invention is the manufacturing method of the light-emitting device, wherein the first bottom electrode layer includes a first transparent conductive layer at a side close to the semiconductor interlayer, the second bottom electrode layer includes a second transparent conductive layer at a side close to the semiconductor interlayer, and in the fifth step, the semiconductor interlayer is formed on the first and second transparent conductive layers.

In the manufacturing method of the light-emitting device pertaining to the present invention, in the above-mentioned structure, the first bottom electrode layer includes the first transparent conductive layer at the side close to the semiconductor interlayer, and the second bottom electrode layer includes the second transparent conductive layer at the side close to the semiconductor interlayer. In addition, the semiconductor interlayer is formed on the first and second transparent conductive layers.

In the manufacturing method of the light-emitting device pertaining to the present invention, the first bottom electrode layer includes the first transparent conductive layer at the side close to the semiconductor interlayer, and the second bottom electrode layer includes the second transparent conductive layer at the side close to the semiconductor interlayer. In addition, the first transparent conductive layer in the first bottom electrode layer and the second transparent conductive layer in the second bottom electrode layer are formed by removing a transparent conductive film formed between the first and second bottom electrode layers through the patterning processing performed by the wet etching method. When the recessed portion of the planarizing film is formed by the dry etching method, the first and second transparent conductive layers formed by the above-mentioned wet etching method are used as masks.

When the recessed portion of the planarizing film is formed by the dry etching method, since the first and second transparent conductive layers are used as masks, there is no need for using a new mask to form the recessed portion. Therefore, the manufacturing procedures can be simplified.

Embodiments of the present invention are described below using several examples.

Note that the Embodiments described below are examples to explain the structures, functions, and effects of the present invention in an understandable manner. The present invention is not limited to these embodiments as long as essential features thereof are exhibited.

Embodiment 1

1. Overall Structure of Display Device 1

Hereinafter, an organic EL display device 1 is used as an example of a light-emitting device.

Figure 2:
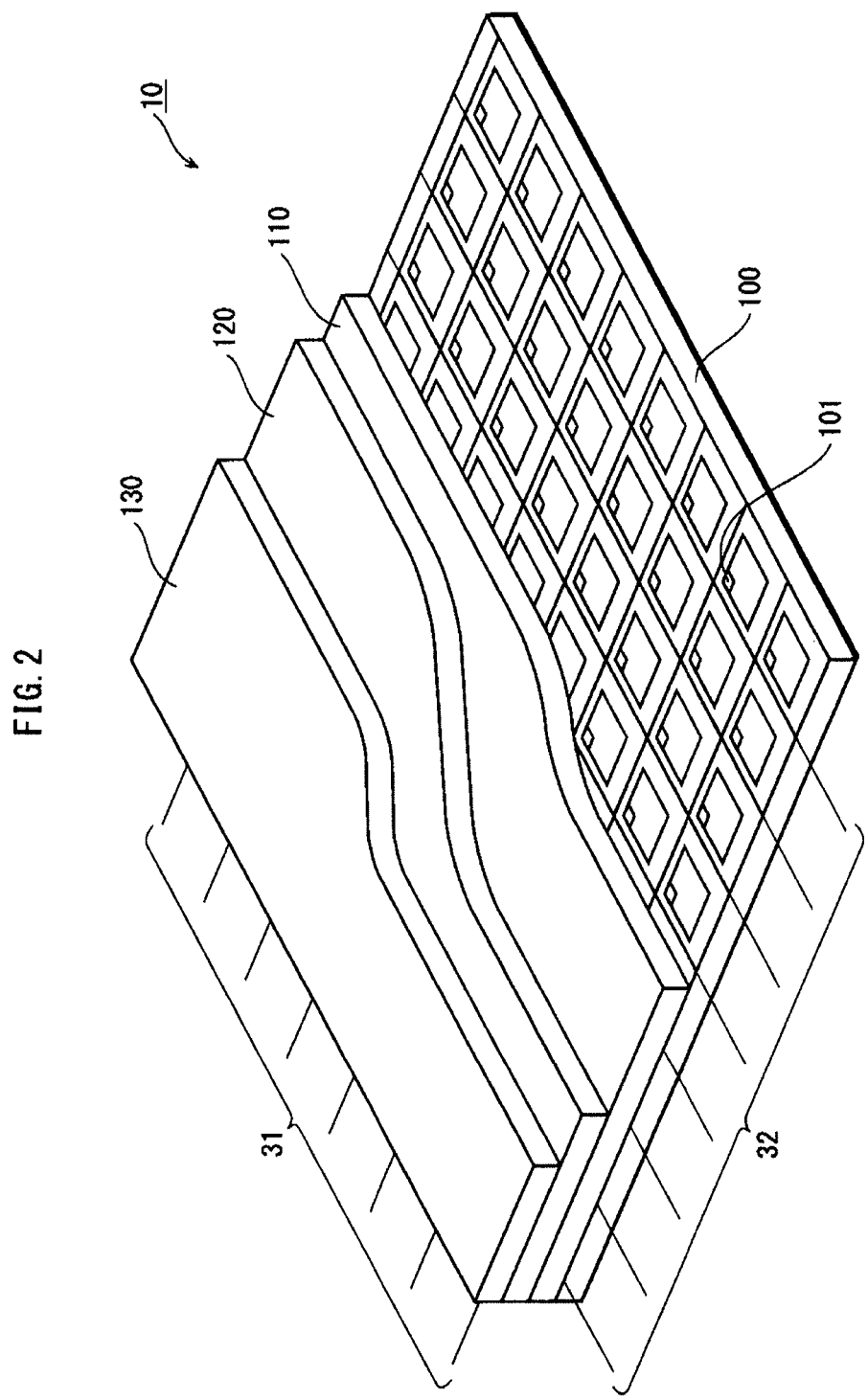
FIG. 2 is a schematic bird's eye view showing a display panel 10 of the organic EL display device 1.

The following describes an overall structure of the organic EL display device 1 pertaining to Embodiment 1 with use of FIGS. 1 and 2.

As shown in FIG. 1, the organic EL display device 1 includes a display panel 10 and a drive control unit 20 connected to the display panel 10. The display panel 10 is an organic EL panel utilizing a phenomenon known as electroluminescence occurring in organic materials. The display panel 10 is composed of a plurality of organic EL elements arranged in rows and columns. As shown in FIG. 2, the display panel 10 includes a TFT 101 formed on a substrate 100 for each sub-pixel. A source signal wiring 31 and a power-supply wiring 32 are connected to the TFT 101. As shown in FIG. 2, a bottom electric layer 110, a light-emitting layered body 120, and a top electric layer 130 are laminated in the stated order on the substrate 100 on which the TFT 101 is formed. Note that the detailed structure of the display panel 10 is described later.

Referring back to FIG. 1, the drive control unit 20 is composed of four drive circuits 21, 22, 23, and 24, and a control circuit 25.

Note that, in the organic EL display device 1 actually used, the drive control unit 20 connected to the display panel 10 is not necessarily arranged in the manner shown in FIG. 1.

2. Structure of Display Panel 10

Figure 3:
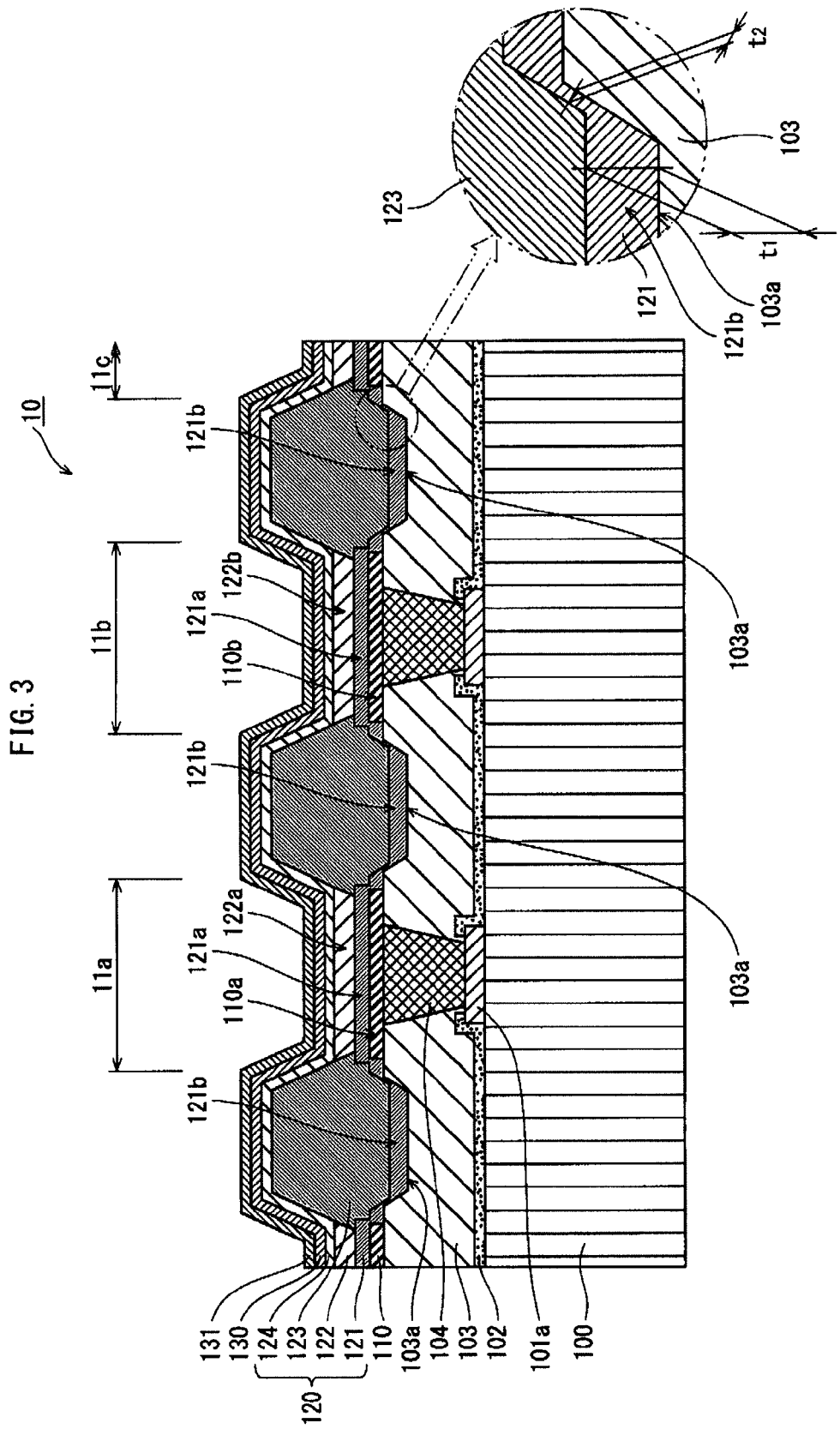
FIG. 3 is a schematic end view showing a part of the structure of the display panel 10.
Figure 4:
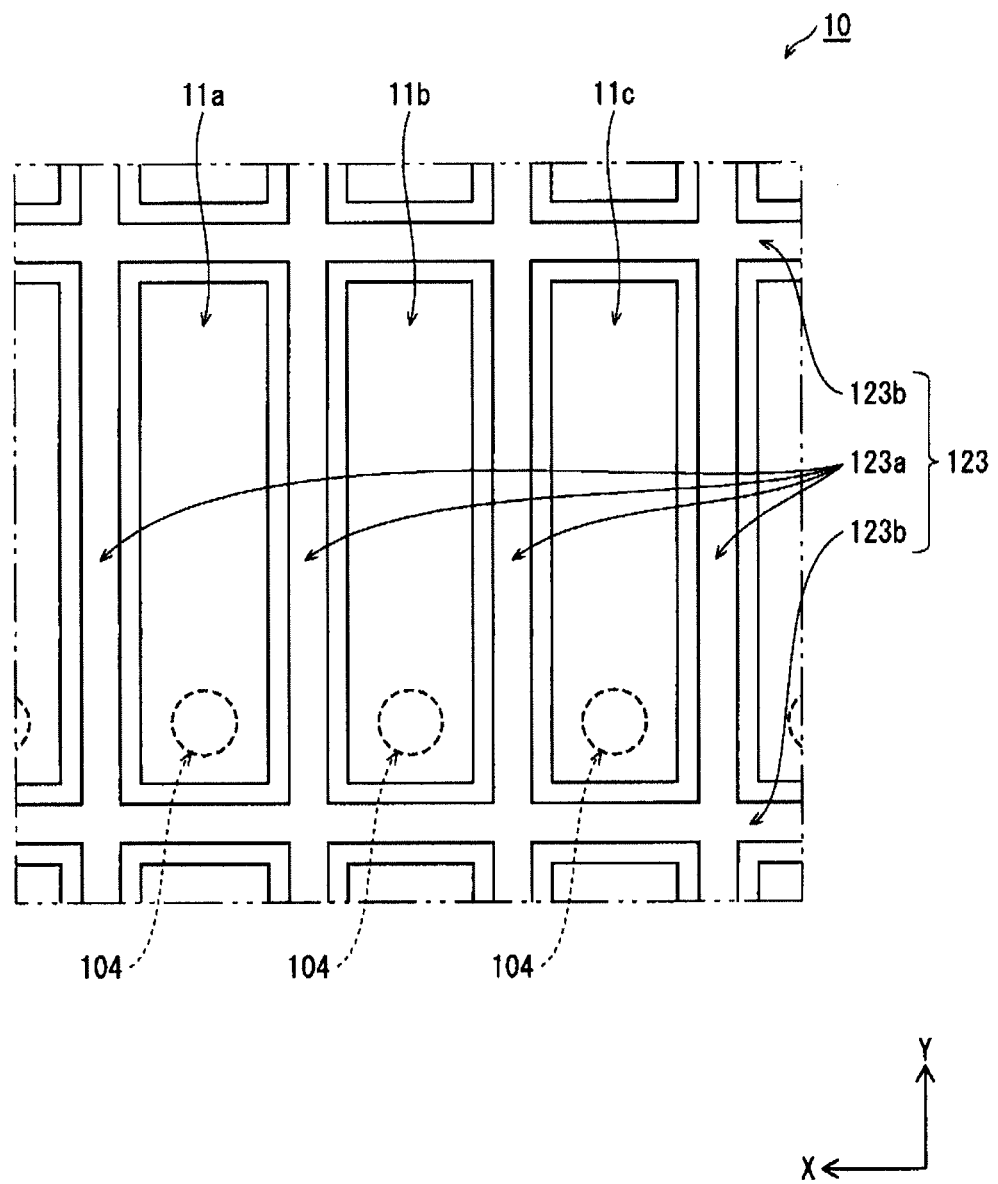
FIG. 4 is a schematic plan view showing a bank 123 of the display panel 10.

The following describes the structure of the display panel 10 with use of FIGS. 3 and 4.

As shown in FIG. 3, the display panel 10 includes an array of sub-pixels 11a, 11b, and 11c each having an organic light-emitting layer of any one of luminescent colors: red (R), green (G), and blue (B). The display panel 10 is a top-emission type organic EL display panel.

On the substrate 100, a TFT layer (in FIG. 3, only a source 101a, a part of the TFT layer, is illustrated), a passivation film 102, and a planarizing film 103 are laminated in the stated order. On the planarizing film 103, a bottom electrode layer (i.e. an anode layer) 110 is formed for each of the sub-pixels 11a, 11b, and 11c. Note that, hereinafter, a part of the bottom electrode layer 110 for the sub-pixel 11a and a part of the bottom electrode layer 110 for the sub-pixel 11b are also referred to as a first bottom electrode layer 110a and a second bottom electrode layer 110b, respectively. The bottom electrode layer 110 is connected to the source 101a of the TFT layer via a contact hole 104 passing through a thickness of the planarizing film 103.

A semiconductor interlayer 121a is formed on the bottom electrode layer 110. The semiconductor interlayer 121a functions as a hole-injection layer and/or a hole-transporting layer. The planarizing film 103 has a recessed portion 103a in an area between adjacent bottom electrode layers 110, and a surface of the planarizing film 103 is lower in the recessed portion 103a than in a non-recessed portion. A recessed portion filling layer 121b made of the same material as the semiconductor interlayer 121a is formed on the surface of the planarizing film 103 in the recessed portion 103a. Note that, hereinafter, both the semiconductor interlayer 121a and the recessed portion filling layer 121b are also collectively referred to as a semiconductor layer 121.

As shown in FIG. 3, a light-emitting layer 122 is formed above the bottom electrode layer 110 for each of the sub-pixels 11a, 11b, and 11c. In areas between adjacent sub-pixels 11a and 11b and sub-pixels 11b and 11c, a bank 123 made of insulating materials is formed so as to stand on the recessed portion filling layer 121b and edge portions of the semiconductor interlayer 121a. The light-emitting layer 122 is divided into parts for sub-pixels 11a, 11b, and 11c by the bank 123. Note that, hereinafter, a part of the light-emitting layer 122 for the sub-pixel 11a and a part of the light-emitting layer 122 for the sub-pixel 11b are also referred to as a first light-emitting layer 122a and a second light-emitting layer 122b, respectively.

As shown in FIG. 4, in the display panel 10, the bank 123 has a so-called "pixel bank" structure in which a bank element 123a extending in a Y direction is formed integrally with a bank element 123b extending in an X direction. The adjacent sub-pixels 11a and 11b and adjacent sub-pixels 11b and 11c in an X direction are separated from each other by the bank element 123a. On the other hand, the adjacent sub-pixels in a Y direction are separated from each other by the bank element 123b.

Referring back to FIG. 3, an electron-injection layer 124, a top electrode layer (cathode layer) 130, and a passivation layer 131 are formed in the stated order so as to continuously cover the light-emitting layer 122 and the bank 123. Note that a laminate composed of the semiconductor layer 121, the light-emitting layer 122, the bank 123, and the electron-injection layer 124 corresponds to the light-emitting layered body 120 shown in FIG. 2.

As shown in FIG. 3, the three consecutive sub-pixels 11a, 11b, and 11c correspond to colors of red (R), green (G), and blue (B), respectively. These sub-pixels construct one pixel as a whole.

a) Substrate 100

Examples of insulating materials used as base materials to form the substrate 100 are: an alkali-free glass, a soda glass, a nonluminescent glass, a phosphoric acid glass, a boric glass, quartz, an acrylic resin, a styrene resin, a polycarbonate resin, an epoxy resin, polyethylene, polyester, a silicone resin, and alumina.

b) Planarizing Film 103

Examples of organic compounds used to form the planarizing film 103 are: polyimide, polyamide, and acrylic resins.

c) Bottom Electrode Layer 110

Examples of materials used to form the bottom electrode layer 110 are: Ag (silver), APC (an alloy of silver, palladium, and copper), ARA (an alloy of silver, rubidium, and gold), MoCr (an alloy of molybdenum and chrome), and NiCr (an alloy of nickel and chrome). When an organic EL display device is a top-emission type as in the case of Embodiment 1, it is preferred that the bottom electrode layer 110 be made of highly reflective materials.

d) Semiconductor Layer 121

Examples of materials used to form the semiconductor layer 121 are: a metal oxide such as $WO_x$ (tungsten oxide) and $MoWO_x$ (oxides of molybdenum and tungsten), a metal nitride, and a metal oxynitride.

e) Light-Emitting Layer 122

When holes and electrons are injected into the light-emitting layer 122 and are recombined to cause an exited state, the light-emitting layer 122 emits light. The light-emitting layer 122 is required to be made of a luminescent organic material that can be changed to a film state by using a wet printing method.

Specifically, the preferable examples of fluorescent materials that can be used to form the light-emitting layer 122 and disclosed in Japanese Patent Application Publication No. H05-163488 are: oxinoid compounds, perylene compounds, coumarin compounds, azacoumarin compounds, oxazole compounds, oxadiazole compounds, perinone compounds, pyrrolopyrrole compounds, naphthalene compounds, anthracene compounds, fluorene compounds, fluoranthene compounds, tetracene compounds, pyrene compounds, coronene compounds, quinolone and azaquinolone compounds, pyrazoline and pyrazolone derivatives, rhodamine compounds, chrysene compounds, phenanthrene compounds, cyclopentadiene compounds, stilbene compounds, diphenylquinone compounds, styryl compounds, butadiene compounds, dicyanomethylene pyran compounds, dicyanomethylene thiopyran compounds, fluorescein compounds, pyrylium compounds, thiapyrylium compounds, selenapyrylium compounds, telluropyrylium compounds, aromatic aldadiene compounds, oligophenylene compounds, thioxanthene compounds, anthracene compounds, cyanine compounds, acridine compounds, metal complexes of 8-hydroxyquinoline compounds, metal complexes of 2-bipyridine compounds, complexes of schiff base and III-group metals, oxinemetal complexes, and rare earth metal complexes.

f) Bank 123

The bank 123 is made of an organic material such as a resin, and has an insulating property. Examples of organic materials used to form the bank 123 are: an acrylic resin, a polyimide resin, and a novolac-type phenolic resin. It is preferred that the bank 123 be resistant to organic solvents. Furthermore, since the bank 123 can be etched and baked, it is preferred that the bank 123 be made of materials resistant enough not to be excessively deformed and degenerated by these etching and baking processes. A surface of the bank 123 may be fluorinated to provide a water repellent effect.

In addition to the above-listed materials, insulating materials having a resistivity of $10^5$ [Ω·cm] or more and having a water repellent effect may be used to form the bank 123. This is because, when materials having a resistivity of less than $10^5$ [Ω·cm] are used to form the bank 123, leak current might flow between the bottom electrode layer 110 and the top electrode layer 130, or between adjacent pixels, resulting in various problems such as an increase in power consumption.

In addition, when hydrophilic materials are used to form the bank 123, a difference in hydrophilicity/water-repellency between a surface of the bank 123 and a surface of the semiconductor interlayer 121a is reduced. Thus, it becomes difficult to selectively form ink containing organic materials for forming the light-emitting layer 122 in areas between adjacent banks 123.

As for the structure of the bank 123, in addition to a single-layer structure as shown in FIG. 3, a multi-layer structure may be adopted. When the multi-layer structure is adopted, layers made of the above-listed materials may be combined, or layers made of inorganic materials and layers made of organic materials may be combined.

g) Electron-Injection Layer 124

The electron-injection layer 124 transports electrons injected from the top electrode layer 130 to the light-emitting layer 122. Examples of materials used to form the electron-injection layer 124 are: barium, phthalocyanine, lithium fluoride, and a combination of these materials.

h) Top Electrode Layer 130

Examples of materials used to form the top electrode layer (i.e. cathode layer) 130 are: ITO, and IZO (indium zinc oxide). In the top-emission type organic EL elements 100a, 100b, and 100c, it is preferable that the top electrode layer 130 be made of light-transmissive materials. Furthermore, it is preferable that the light-transmissive materials have a transmittance of 80% or more.

In addition to the above-listed materials, alkali metals and alkaline earth metals can be used to form the top electrode layer 130. Alternatively, the top electrode layer 130 may have a structure in which a layer including a halide of these materials and a layer including silver are laminated in the stated order. In the top electrode layer 130 having the above structure, the layer including silver may be made of silver alone, or a silver alloy. In order to improve light extraction efficiency, a highly transparent refractive index adjustment layer may be formed on the layer including silver.

i) Passivation Layer 131

The passivation layer 131 inhibits the light-emitting layer 122 from being exposed to the water and air. Examples of materials used to form the passivation layer 131 are: SiN (silicon nitride), SiON (silicon oxynitride). In the top-emission type organic EL device, it is preferred that the passivation layer 131 be made of light-transmissive materials.

3. Recessed Portion 103a of Planarizing Film 103 and Semiconductor Layer 121

As shown in FIG. 3, in the organic EL display device 1 pertaining to Embodiment 1, in the display panel 10, the planarizing film 103 has the recessed portion 103a in an area between the first bottom electrode layer 110a and the second bottom electrode layer 110b. The surface of the planarizing film 103 is lower in the recessed portion 103a than in a non-recessed portion. The recessed portion filling layer 121b is formed on the surface of the planarizing film 103 in the recessed portion 103a. As shown in a circle outlined by a long dashed double-short dashed line in FIG. 3, a thickness $t_2$ at the edge portions of the recessed portion filling layer 121b formed on the surface of the planarizing film 103 in the recessed portion 103a is less than a thickness $t_1$ at the middle of the recessed portion filling layer 121b.

Therefore, due to the above-mentioned relationship between the thicknesses $t_1$ and $t_2$, the recessed portion filling layer 121b formed on the surface of the planarizing film 103 in the recessed portion 103a has low electrical conductivity at the edge portions thereof (the portion with the thickness $t_2$). The recessed portion filling layer 121b formed on the surface of the planarizing film 103 in the recessed portion 103a substantially prevents (i) the first bottom electrode layer 110a and the semiconductor interlayer 121a formed on the first bottom electrode layer 110a and (ii) the second bottom electrode layer 110b and the semiconductor interlayer 121a formed on the second bottom electrode layer 110b from being electrically connected with each other. Therefore, the leak current is prevented from flowing between the first bottom electrode layer 110a and the second bottom electrode layer 110b.

Accordingly, the organic EL display device 1 pertaining to Embodiment 1 can effectively prevent the occurrence of the crosstalk.

In addition, as shown in FIG. 3, in the display panel 10, since the bank 123 is embedded in the recessed portion 103a of the planarizing film 103, adhesion of the bank 123 is improved. This structure makes the bank 123 difficult to be detached. Therefore, the organic EL display device 1 pertaining to Embodiment 1 is highly reliable.

4. Manufacturing Method of Display Panel 10

The following describes the manufacturing method of the display panel 10 with use of FIGS. 5A to 7C. In FIGS. 5A to 7C, parts of the display panel 10 are shown schematically.

Figure 5A:
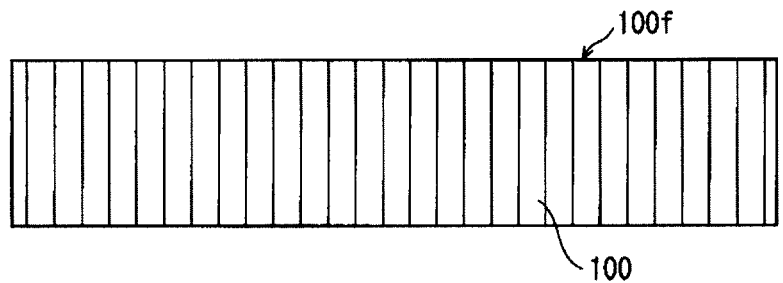
FIGS. 5A, 5B, and 5C are schematic end views showing a process of manufacturing the display panel 10.

At first, as shown in FIG. 5A, the substrate 100 is prepared.

Next, on an upper main surface 100f of the substrate 100 in a Z direction, the TFT layer and the passivation film 102 are formed. Then, a planarizing film 1030 is laminated so as to cover the TFT layer and the passivation film 102 (see FIG. 5B). Note that, in FIG. 5B, only the sources 101a of the TFT layer are illustrated for the sake of clarity.

Figure 5B:
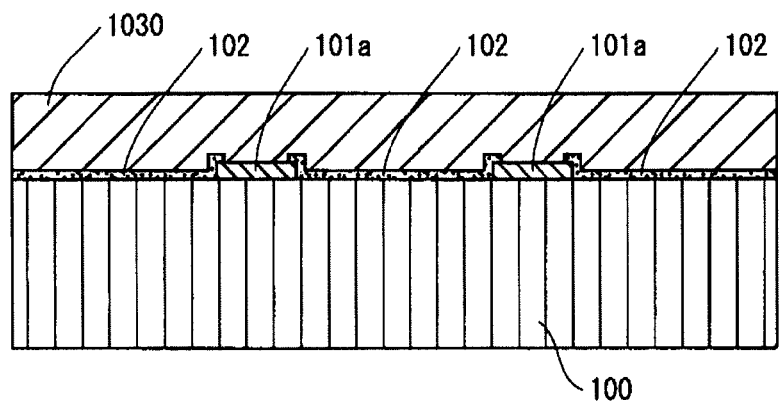
Figure 5C:
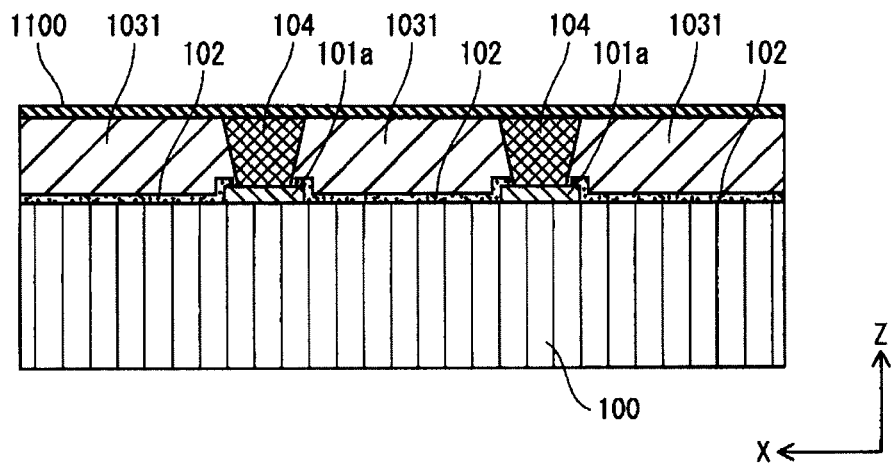

Next, as shown in FIG. 5C, the contact holes 104 are formed in the planarizing film 1030 at positions corresponding to the sources 101a of the TFT layer to form a planarizing film 1031. A metal film (e.g. a thin Ag film) 1100 is formed on the planarizing film 1031. The metal film 1100 is formed by a sputtering method, a vacuum deposition method and the like.

Figure 6A:
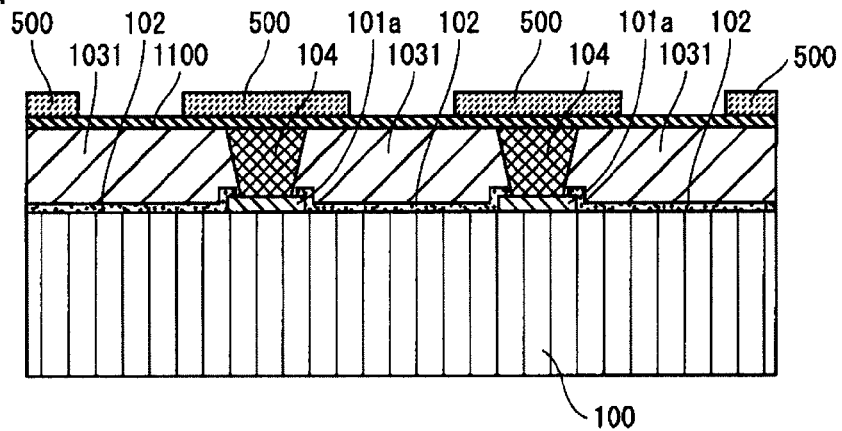
FIGS. 6A, 6B, and 6C are schematic end views showing a process of manufacturing the display panel 10.

Next, as shown in FIG. 6A, photosensitive resists 500 are deposited on the metal film 1100 in areas where the bottom electrode layer 110 is to be formed. Then, as shown in FIG. 6B, the metal film 1100 is patterned by a photolithography method and an etching method to form the bottom electrode layer 110 including the first bottom electrode layer 110a and the second bottom electrode layer 110b.

Figure 6B:
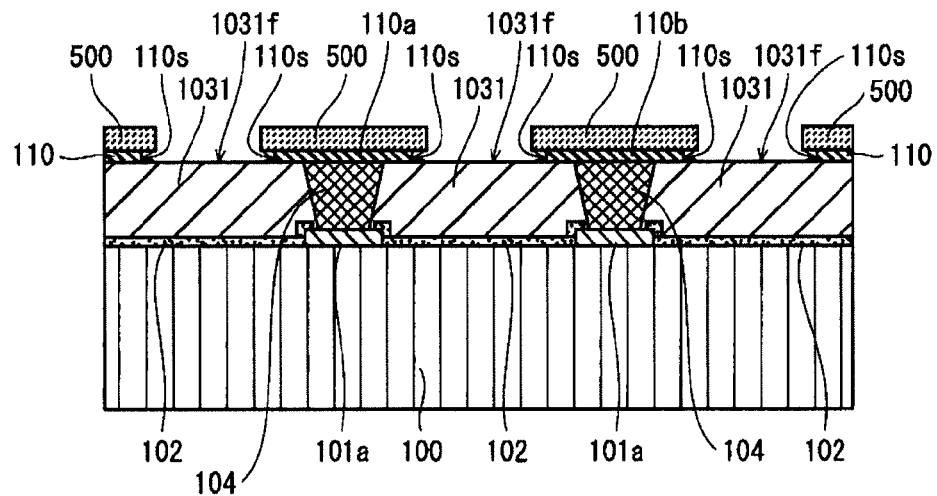

Note that, as shown in FIG. 6B, the metal film 1100 is etched such that edges 110s of the bottom electrode layer 110 are under the resist 500.

Figure 6C:
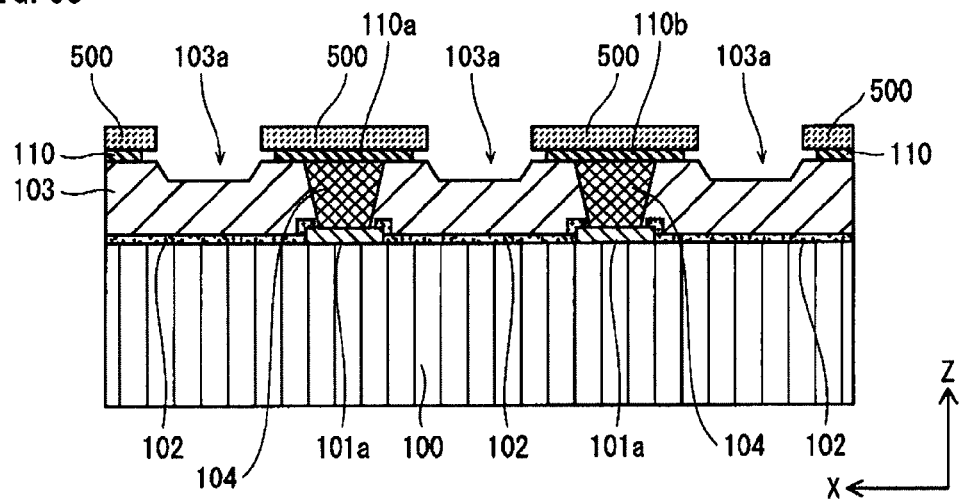

Next, by performing an etching (e.g. dry etching) processing in a state where the resist 500 is left on the bottom electrode layer 110 as it is, the recessed portion 103a of the planarizing film 103 is formed in an area 1031f between the first bottom electrode layer 110a and the second bottom electrode layer 110b where the resist 500 is not formed (see FIG. 6C). Note that, as shown in FIG. 6C, the edge 110s (see FIG. 6B) of the bottom electrode layer 100 is at a little distance from a verge of an opening of the recessed portion 103a. This is attributable to the fact that the edges 110s of the bottom electrode layer 110 are under the resist 500, as shown in FIGS. 6B and 6C.

The method for forming the recessed portion 103a of the planarizing film 103 in FIG. 6C is not limited to the dry etching method. The recessed portion 103a may be formed by a wet etching method.

Next, as shown in FIG. 7A, semiconductor materials are disposed on the bottom electrode layer 110 and the surface of the planarizing film 103 in the recessed portion 103a to form the semiconductor layer 121. The semiconductor layer 121 includes the semiconductor interlayer 121a formed on the bottom electrode layer 110 and the recessed portion filling layer 121b formed on the surface of the planarizing film 103 in the recessed portion 103a.

Next, an insulating material layer is formed, for example, by a spin coat method, on the semiconductor layer 121 to form the bank 123. The insulating material layer is patterned by being exposed and developed with use of a photomask. Then, as shown in FIG. 7B, the bank 123 is formed through a cleaning procedure using cleaning solution.

Next, as shown in FIG. 7C, an ink composition including a material of the light-emitting layer 122 is dropped, by an ink jet method, in areas divided by the bank 123 and dried to form the light-emitting layer 122. Furthermore, the electron-injection layer 124, the top electrode layer 130, and the passivation layer 131 are laminated on the light-emitting layer 122.

In addition to the ink jet method, the light-emitting layer 122 may be formed by a dispenser method, a nozzle coat method, a spin coat method, an intaglio printing method, a letterpress printing method, and the like. Furthermore, in order to dry the ink composition, drying in a vacuum and drying under a nitrogen atmosphere are performed in this order.

By way of examples, a vacuum deposition method can be used to form the electron-injection layer 124, and a plasma coating method can be used to form the top electrode layer 130.

Main parts of the display panel 10 are completed in the above-mentioned manner.

In the manufacturing method of the display panel 10 pertaining to Embodiment 1, as shown in FIG. 7A, the semiconductor layer 121 is formed in a state where the recessed portion 103a of the planarizing film 103 is formed in an area between the first bottom electrode layer 110a and the second bottom electrode layer 110b. With a shadowing effect obtained in a side sub-surface part of the surface of the planarizing film in the recessed portion 103a, the thickness $t_2$ at the edge portions of the recessed portion filling layer 121b becomes less than the thickness $t_1$ at the middle of the recessed portion filling layer 121b (see a circle outlined by a long dashed double-short dashed line in FIG. 3). Therefore, the semiconductor interlayer 121a formed on the first bottom electrode layer 110a and the recessed portion filling layer 121b adjacent to the semiconductor interlayer 121a are not substantially electrically connected with each other due to a decrease in conductivity in the side sub-surface part of the surface of the planarizing film in the recessed portion 103a. The same applies to the semiconductor interlayer 121a formed on the second bottom electrode layer 110b and the recessed portion filling layer 121b adjacent to the semiconductor interlayer 121a.

Therefore, since the leak current is prevented from flowing between the first bottom electrode layer 110a and the second bottom electrode layer 110b in the display panel 10, the crosstalk is not caused.

Furthermore, in the manufacturing method pertaining to Embodiment 1, as shown in FIGS. 6B and 6C, the resist 500 for forming the bottom electrode layer 110 is not removed even after the formation of the bottom electrode layer 110, and is used as a mask for forming the recessed portion 103a of the planarizing film 103. This structure eliminates the need for the use of a new mask to form the recessed portion 103a. The manufacturing procedures can be simplified, and thus it becomes possible to reduce the manufacturing costs.

Embodiment 2

1. Structure of Display Panel 10

An organic EL display device pertaining to Embodiment 2 has the structure similar to the structure of the organic EL display device 1 pertaining to Embodiment 1 except for the structure of a display panel 12. The following describes the structure of the display panel 12 with use of FIG. 8.

Figure 8:
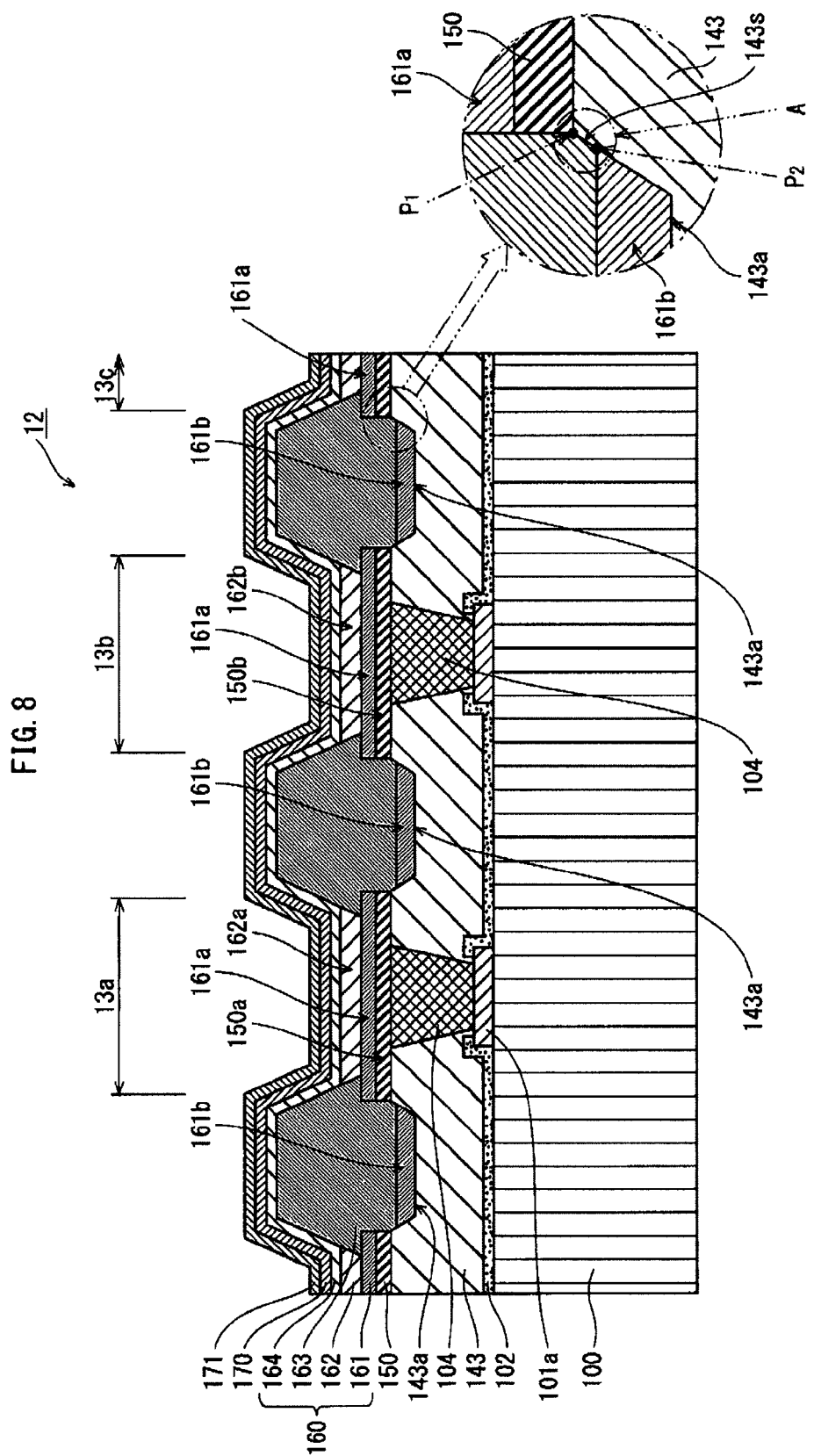
FIG. 8 is a schematic end view showing a part of the structure of a display panel 12 of an organic EL display device pertaining to Embodiment 2.

As shown in FIG. 8, the display panel 12 pertaining to Embodiment 2 is a top-emission type organic EL display panel that includes an array of sub-pixels 13a, 13b, and 13c each having an organic light-emitting layer of any one of luminescent colors: red (R), green (G), and blue (B).

The TFT layer (in FIG. 8, only a source 101a, a part of the TFT layer, is illustrated) and the passivation film 102 that are formed on the substrate 100, and the contact holes 104 in a planarizing film 143 have the same structure as those included in the display panel 10 pertaining to Embodiment 1.

As shown in FIG. 8, in the display panel 12, a recessed portion 143a is formed in an area between adjacent bottom electrode layers (i.e. anode layers) 150. Then, a semiconductor layer 161 is formed on the bottom electrode layer 150. The semiconductor layer 161 includes (i) a semiconductor interlayer 161a that functions as a hole-injection layer and/or a hole-transporting layer, and (ii) a recessed portion filling layer 161b that is formed on a surface of the planarizing film 143 in the recessed portion 143a and is made of the same material as the semiconductor interlayer 161a.

As shown in FIG. 8, a light-emitting layer 162, an electron-injection layer 164, a top electrode layer (cathode layer) 170, and a passivation layer 171 are laminated on the semiconductor interlayer 161a in the stated order. A bank 163 for dividing the light-emitting layer 162 into parts for respective sub-pixels 13a, 13b, and 13c is formed. The semiconductor interlayer 161a, the light-emitting layer 162, the bank 163, and the electron-injection layer 164 constitute a light-emitting layered body 160 as a whole. Similarly to the light-emitting layer 122 in the display panel 10 pertaining to Embodiment 1, the light-emitting layer 162 includes a first light-emitting layer 162a formed above a first bottom electrode layer 150a and a second light-emitting layer 162b formed above a second bottom electrode layer 150b.

Although a top view of the display panel 12 pertaining to Embodiment 2 is not shown, the bank 163 in the display panel 12 has the so-called "pixel bank" structure similarly to the bank 123 in the display panel 10 pertaining to Embodiment 1.

2. Recessed Portion 143a of Planarizing Film 143 and Semiconductor Layer 161

As shown in FIG. 8, in the display panel 12 pertaining to Embodiment 2, the planarizing film 143 has the recessed portion 143a in an area between the first bottom electrode layer 150a and the second bottom electrode layer 150b. The display panel 12 is similar to the display panel 10 pertaining to Embodiment 1 in that the surface of the planarizing film 143 is lower in the recessed portion 143a than in a non-recessed portion. Furthermore, the display panel 12 is similar to the display panel 10 pertaining to Embodiment 1 in that the recessed portion filling layer 161b is formed on the surface of the planarizing film 143 in the recessed portion 143a.

As shown in a circle outlined by a long dashed double-short dashed line in FIG. 8, however, in the display panel 12 pertaining to Embodiment 2, the surface of the planarizing film 143 in recessed portion 143a includes a side sub-surface 143s, on a part of which the semiconductor layer 161 is not formed (i.e. the part between points $P_1$ and $P_2$ indicated by an arrow A).

In the display panel 12 pertaining to Embodiment 2, since the surface of the planarizing film 143 in the recessed portion 143a includes the side sub-surface 143s, on the part of which the semiconductor layer 161 is not formed, the semiconductor interlayer 161a formed on the first bottom electrode layer 150a and the semiconductor interlayer 161a formed on the second bottom electrode layer 150b are separated from each other by the part. With this structure, the semiconductor interlayers 161a for respective sub-pixels 13a, 13b, and 13c are not continuously formed beyond the recessed portion 143a. Since the first bottom electrode layer 150a and the second bottom electrode layer 150b are not electrically connected with each other by the semiconductor layer 161, the leak current is prevented from flowing between the first bottom electrode layer 150a and the second bottom electrode layer 150b.

Accordingly, the display panel 12 pertaining to Embodiment 2 can prevent the occurrence of the crosstalk.

In addition, as shown in FIG. 8, in the display panel 12 pertaining to Embodiment 2, since the bank 163 is embedded in the recessed portion 143a of the planarizing film 143, adhesion of the bank 163 is improved. This structure makes the bank 163 difficult to be detached. Therefore, the organic EL display device pertaining to Embodiment 2 is highly reliable.

3. Manufacturing Method of Display Panel 12

The following describes the manufacturing method of the display panel 12 with use of FIGS. 9A to 10C. In FIGS. 9A to 10C, parts of the display panel 12 are shown schematically.

Figure 9A:
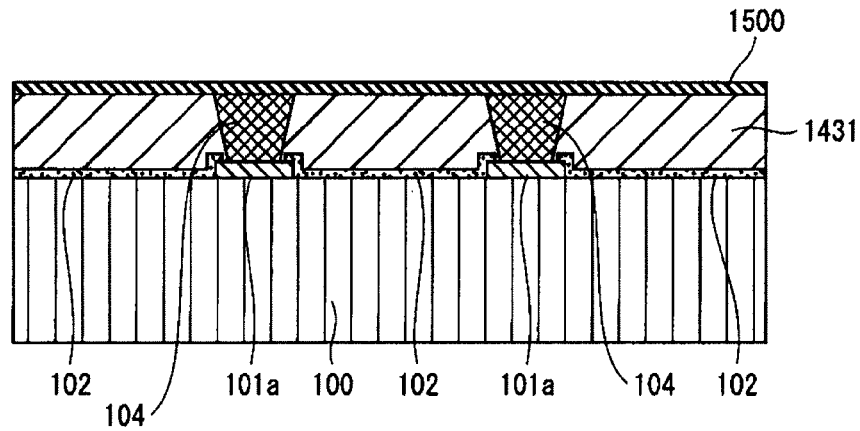
FIGS. 9A, 9B, and 9C are schematic end views showing a process of manufacturing the display panel 12.

First, as shown in FIG. 9A, by performing the steps shown in FIGS. 5A to 5C in Embodiment 1, the TFT layer (in FIG. 9A, only sources 101a, parts of the TFT layer, are illustrated), the passivation film 102, and a planarizing film 1431 are formed on the substrate 100, the contact hole 104 is formed in the planarizing film 1431, and a metal film 1500 is formed on the planarizing film 1431.

Figure 9B:
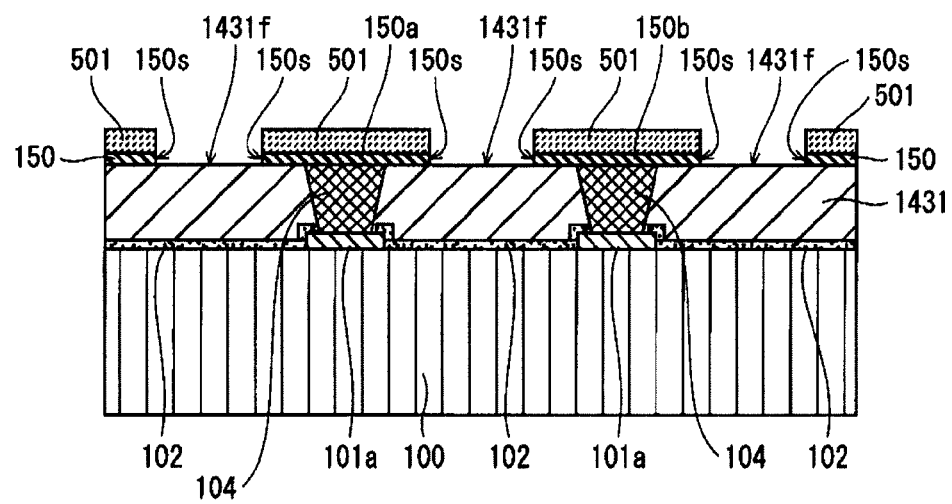

Next, as shown in FIG. 9B, photosensitive resists 501 are deposited on the metal film 1500 in areas where the bottom electrode layer 150 is to be formed. Then, as shown in FIG. 9B, the metal film 1500 is patterned by a photolithography method and an etching method to form the bottom electrode layer 150 including the first bottom electrode layer 150a and the second bottom electrode layer 150b.

In the manufacturing method pertaining to Embodiment 1, the edges 110s of the bottom electrode layer 110 are under the resist 500 after the etching process. In the manufacturing method pertaining to Embodiment 2, however, as shown in FIG. 9B, edges 150s of the bottom electrode layer 150 match edges of the resist 501 after the etching process.

Next, similarly to the manufacturing method pertaining to Embodiment 1, etching (e.g. dry etching) processing is performed in a state where the resist 501 is left on the bottom electrode layer 150 as it is. In the above-mentioned manner, the recessed portion 143a of the planarizing film 143 is formed in an area 1431f between the first bottom electrode layer 150a and the second bottom electrode layer 150b where the resist 501 is not formed (see FIG. 9C).

In the manufacturing method pertaining to Embodiment 1, the method for forming the recessed portion 143a of the planarizing film 143 is not limited to the dry etching method. The recessed portion 143a may be formed by a wet etching method.

Figure 10A:
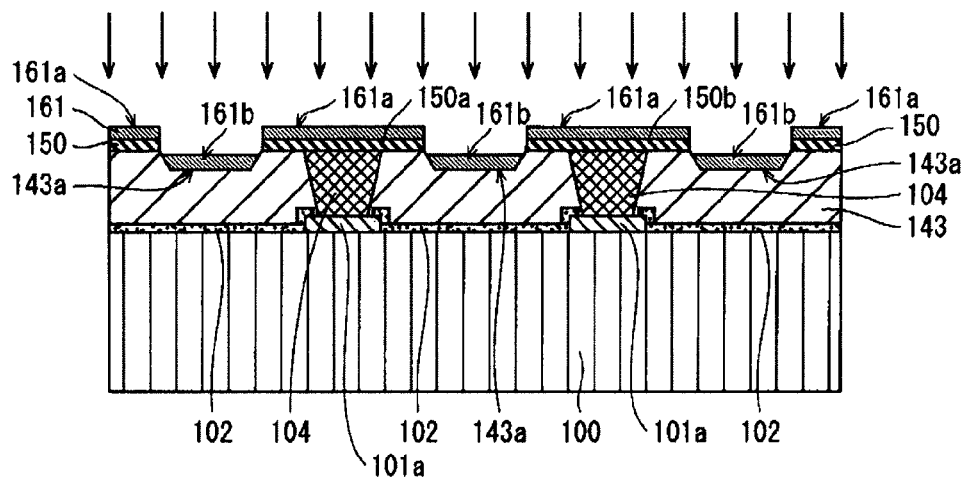
FIGS. 10A, 10B, and 10C are schematic end views showing a process of manufacturing the display panel 12.

Next, as shown in FIG. 10A, semiconductor materials are disposed on the bottom electrode layer 150 and the surface of the planarizing film 143 in the recessed portion 143a to form the semiconductor layer 161. The semiconductor layer 161 includes the semiconductor interlayer 161a formed on the bottom electrode layer 150 and the recessed portion filling layer 161b formed on the surface of the planarizing film 143 in the recessed portion 143a.

Figure 10B:
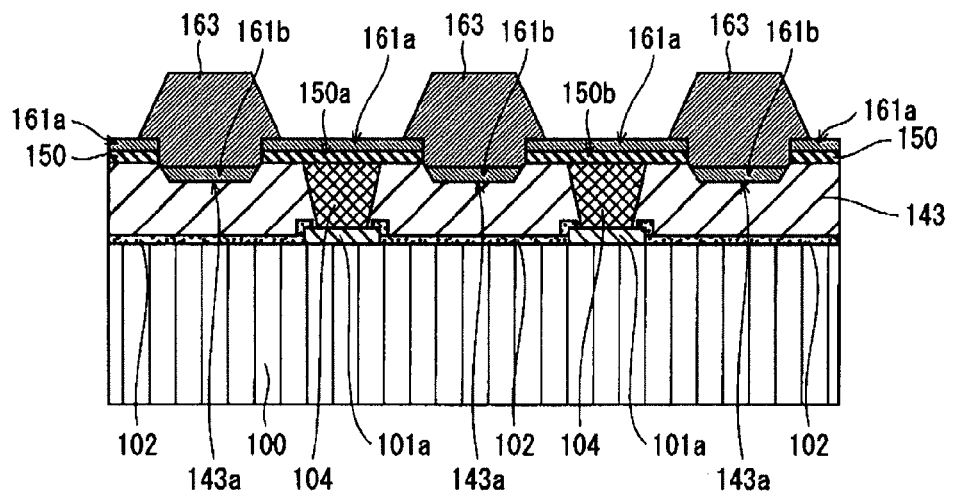

Next, an insulating material layer is formed, for example, by a spin coat method, on the semiconductor layer 161 to form the bank 163. The insulating material layer is patterned by being exposed and developed with use of a photomask. Then, as shown in FIG. 10B, the bank 163 is formed through a cleaning procedure using cleaning solution.

Figure 10C:
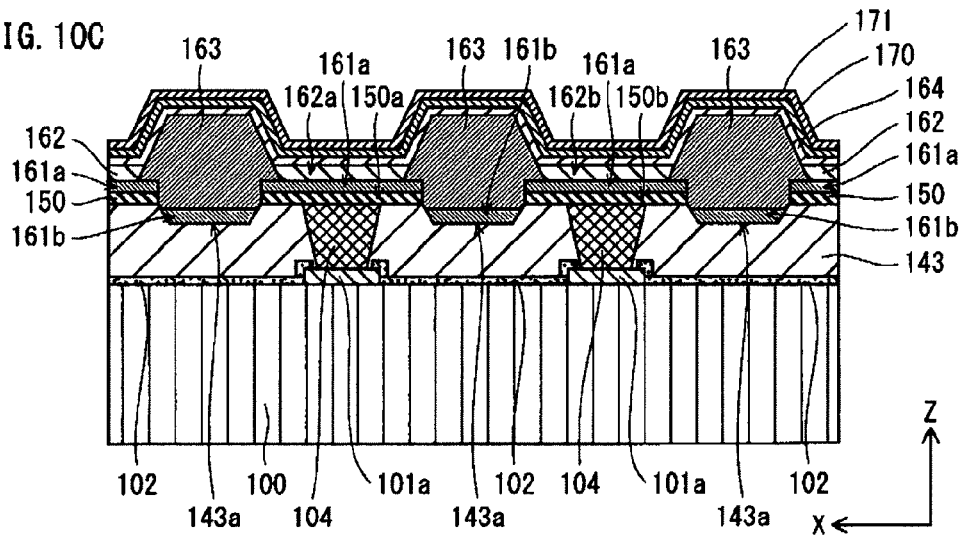

Next, as shown in FIG. 10C, an ink composition including a material of the light-emitting layer 162 is dropped, by an ink jet method, in areas divided by the bank 163 and dried to form the light-emitting layer 162. Furthermore, the electron-injection layer 164, the top electrode layer 170, and the passivation layer 171 are laminated on the light-emitting layer 162.

Similarly to the manufacturing method pertaining to Embodiment 1, in addition to the ink jet method, the light-emitting layer 162 may be formed by a dispenser method, a nozzle coat method, a spin coat method, an intaglio printing method, a letterpress printing method, and the like. Furthermore, in order to dry the ink composition, drying in a vacuum and drying under a nitrogen atmosphere are performed in this order.

Similarly to the manufacturing method pertaining to Embodiment 1, by way of examples, a vacuum deposition method can be used to form the electron-injection layer 164, and a plasma coating method can be used to form the top electrode layer 170.

Main parts of the display panel 12 are completed in the above-mentioned manner.

In the manufacturing method of the display panel 12 pertaining to Embodiment 2, as shown in FIG. 10A, the semiconductor layer 161 is formed in a state where the recessed portion 143a of the planarizing film 143 is formed in an area between the first bottom electrode layer 150a and the second bottom electrode layer 150b. With a shadowing effect, the surface of the planarizing film 143 in recessed portion 143a includes a side sub-surface 143s, on a part of which the semiconductor layer 161 is not formed (see a circle outlined by a long dashed double-short dashed line in FIG. 8). Therefore, the semiconductor interlayer 161a formed on the first bottom electrode layer 150a and the recessed portion filling layer 161b adjacent to the semiconductor interlayer 161a are not substantially electrically connected with each other. The same applies to the semiconductor interlayer 161a formed on the second bottom electrode layer 150b and the recessed portion filling layer 161b adjacent to the semiconductor interlayer 161a.

Therefore, since the leak current is further prevented from flowing between the first bottom electrode layer 150a and the second bottom electrode layer 150b in the display panel 12 compared with a case of the display panel 10 pertaining to Embodiment 1, the crosstalk is not caused.

Figure 9C:
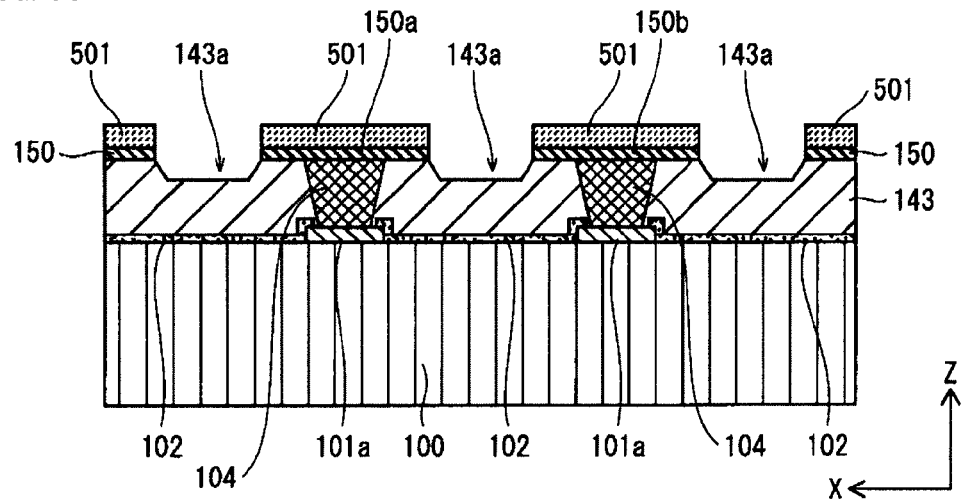

Furthermore, in the manufacturing method pertaining to Embodiment 2, as shown in FIGS. 9B and 9C, the resist 501 for forming the bottom electrode layer 150 is not removed even after the formation of the bottom electrode layer 150, and is used as a mask for forming the recessed portion 143a of the planarizing film 143. This structure eliminates the need for the use of a new mask to form the recessed portion 143a. The manufacturing procedures can be simplified, and thus it becomes possible to reduce the manufacturing costs.

Note that, in the display panel 12 pertaining to Embodiment 2, a shortest distance between (i) a lowest point on the surface of the planarizing film 143 in the recessed portion and (ii) a point on an imaginary surface that coincides with the surface of the planarizing film in the non-recessed portion is greater than the thickness of the recessed portion filling layer 161b formed on the surface of the planarizing film 143 in the recessed portion 143a (the thickness of the recessed portion filling layer 161b formed at a middle of the recessed portion 143a). This is to allow the recessed portion filling layers 161b to be completely separated from the semiconductor interlayer 161a and the bottom electrode layer 150.

Embodiment 3

1. Structure of Display Panel 14

An organic EL display device pertaining to Embodiment 3 has the structure similar to the structure of the organic EL display device 1 pertaining to Embodiments 1 and 2 except for the structure of a display panel 14. The following describes the structure of the display panel 14 with use of FIG. 11.

Figure 11:
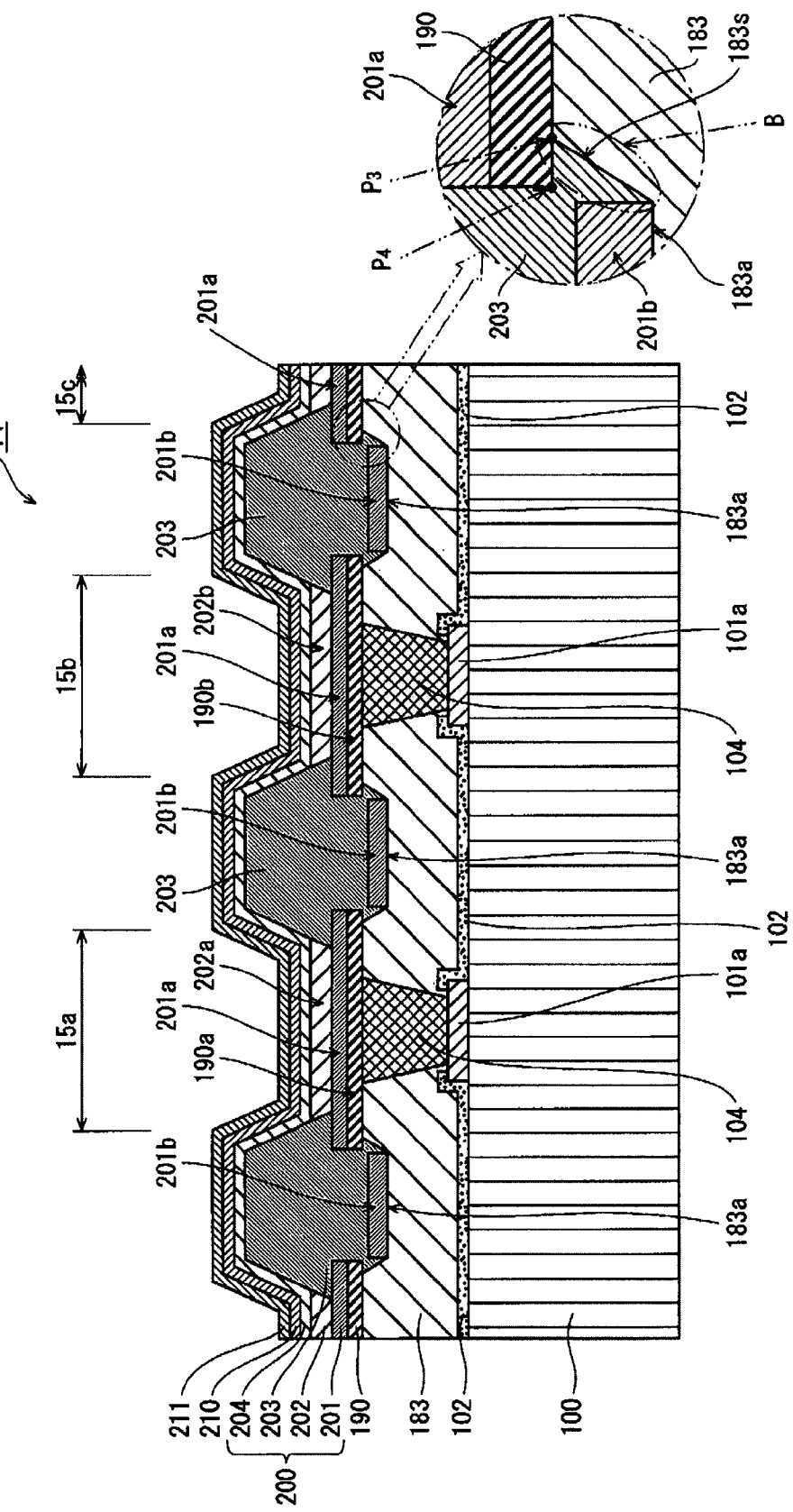
FIG. 11 is a schematic end view showing a part of the structure of a display panel 14 of an organic EL display device pertaining to Embodiment 3.

As shown in FIG. 11, the display panel 14 pertaining to Embodiment 3 is a top-emission type organic EL display panel that includes an array of sub-pixels 15a, 15b, and 15c each having an organic light-emitting layer of any one of luminescent colors: red (R), green (G), and blue (B).

The TFT layer (in FIG. 11, only sources 101a, parts of the TFT layer, are illustrated) and the passivation film 102 that are formed on the substrate 100, and the contact holes 104 in a planarizing film 183 have the same structure as those included in the display panels 10 and 12 pertaining to Embodiments 1 and 2, respectively.

As shown in FIG. 11, in the display panel 14, the planarizing film 183 has a recessed portion 183a in an area between adjacent bottom electrode layers (i.e. anode layers) 190. Then, a semiconductor layer 201 is formed on the bottom electrode layer 190. The semiconductor layer 201 includes (i) a semiconductor interlayer 201a that functions as a hole-injection layer and/or a hole-transporting layer, and (ii) a recessed portion filling layer 201b that is formed on a surface of the planarizing film 183 in the recessed portion 183a and is made of the same material as the semiconductor interlayer 201a.

As shown in FIG. 11, a light-emitting layer 202, an electron-injection layer 204, a top electrode layer (cathode layer) 210, and a passivation layer 211 are laminated on the semiconductor interlayer 201a in the stated order. A bank 203 for dividing the light-emitting layer 202 into parts for respective sub-pixels 15a, 15b, and 15c is formed. The semiconductor interlayer 201a, the light-emitting layer 202, the bank 203, and the electron-injection layer 204 constitute a light-emitting layered body 200 as a whole. Similarly to the light-emitting layers 122 and 162 in the display panels 10 and 12 pertaining to Embodiments 1 and 2, respectively, the light-emitting layer 202 includes a first light-emitting layer 202a formed above a first bottom electrode layer 190a and a second light-emitting layer 202b formed above a second bottom electrode layer 190b.

The bank 203 in the display panel 14 pertaining to Embodiment 3 also has the so-called "pixel bank" structure.

2. Recessed Portion 183a of Planarizing Film 183 and Semiconductor Layer 201

As shown in FIG. 11, in the display panel 14 pertaining to Embodiment 3, the planarizing film 183 has the recessed portion 183a in an area between the first bottom electrode layer 190a and the second bottom electrode layer 190b. The display panel 14 is similar to the display panels 10 and 12 pertaining to Embodiments 1 and 2, respectively, in that the surface of the planarizing film 183 is lower in the recessed portion 183a than in a non-recessed portion. Furthermore, the display panel 14 is similar to the display panels 10 and 12 pertaining to Embodiments 1 and 2, respectively, in that the recessed portion filling layer 201b is formed on the surface of the planarizing film 183 in the recessed portion 183a.

As shown in a circle outlined by a long dashed double-short dashed line in FIG. 11, in the display panel 14 pertaining to Embodiment 3, the bottom electrode layer 190 overhangs the recessed portion 183a of the planarizing film 183 so that a verge of an opening (a point $P_3$) of the recessed portion 183a is at a position that is set back from an edge (a point $P_4$) of the bottom electrode layer 190. Therefore, since the surface of the planarizing film 183 in the recessed portion 183a includes a side sub-surface 183s, on a part of which the semiconductor layer 201 is not formed (i.e. the part located below the bottom electrode layer 190 indicated by an arrow B), the semiconductor interlayer 201a formed on the first bottom electrode layer 190a and the semiconductor interlayer 201a formed on the second bottom electrode layer 190b are separated from each other by the part.

With this structure, the semiconductor interlayers 201a for respective sub-pixels 15a, 15b, and 15c are not continuously formed beyond the recessed portion 183a. Therefore, in the display panel 14, since the first bottom electrode layer 190a and the second bottom electrode layer 190b are not electrically connected with each other by the semiconductor layer 201, the leak current is prevented from flowing between the first bottom electrode layer 190a and the second bottom electrode layer 190b. In Embodiment 3, at least a part of the recessed portion 183a is below the bottom electrode layer 190, and the semiconductor layer 201 is divided at the part. Therefore, the leak current is further prevented from flowing between the first bottom electrode layer 190a and the second bottom electrode layer 190b in the display panel 14 compared with a case of the display panel 12 pertaining to Embodiment 2.

Accordingly, the display panel 14 pertaining to Embodiment 3 can prevent the occurrence of the crosstalk.

In addition, as shown in FIG. 11, in the display panel 14 pertaining to Embodiment 3, the bank 203 is embedded in the recessed portion 183a of the planarizing film 183. This structure makes the bank 203 difficult to be detached as described above. Therefore, the organic EL display device pertaining to Embodiment 3 is highly reliable.

3. Manufacturing Method of Display Panel 14

The following describes the manufacturing method of the display panel 14 with use of FIGS. 12A to 13C. In FIGS. 12A to 13C, parts of the display panel 14 are shown schematically.

Figure 12A:
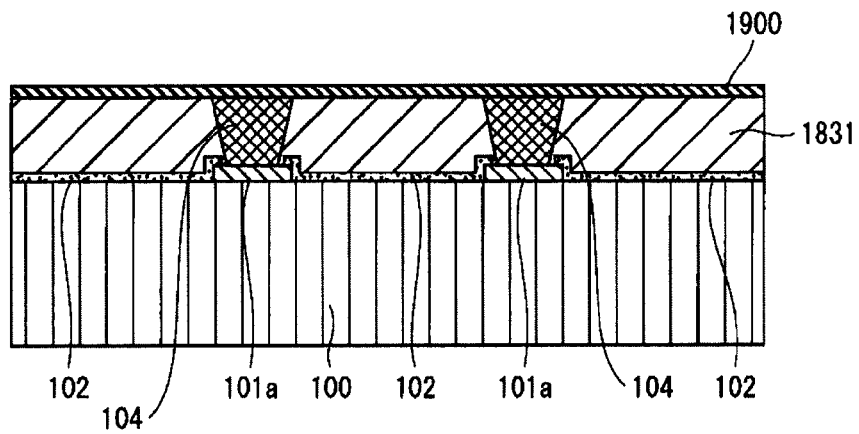
FIGS. 12A, 12B, and 12C are schematic end views showing a process of manufacturing the display panel 14.

First, as shown in FIG. 12A, by performing the steps shown in FIGS. 5A to 5C in Embodiment 1, the TFT layer (in FIG. 12A, only sources 101a, parts of the TFT layer, are illustrated), the passivation film 102, and a planarizing film 1831 are formed on the substrate 100, the contact hole 104 is formed in the planarizing film 1831, and a metal film 1900 is formed on the planarizing film 1831.

Figure 12B:
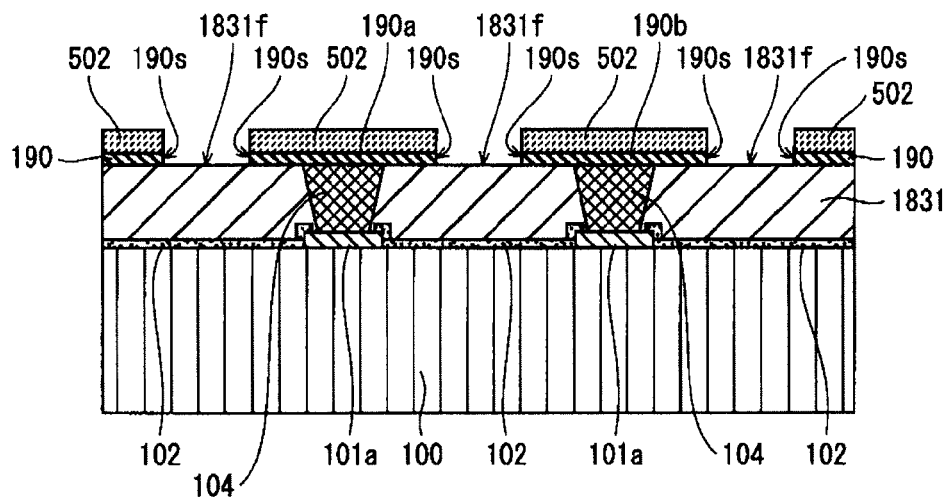

Next, as shown in FIG. 12B, photosensitive resists 502 are deposited on the metal film 1900 in areas where the bottom electrode layer 190 is to be formed. Then, as shown in FIG. 12B, the metal film 1900 is patterned by a photolithography method and an etching method to form the bottom electrode layer 190 including the first bottom electrode layer 190a and the second bottom electrode layer 190b. Note that, in the manufacturing method pertaining to Embodiment 3, as shown in FIG. 12B, edges 190s of the bottom electrode layer 190 match edges of the resist 502 after the etching process.

Next, similarly to the manufacturing methods pertaining to Embodiments 1 and 2, etching (e.g. dry etching) processing is performed in a state where the resist 502 is left on the bottom electrode layer 190 as it is. In the above-mentioned manner, the recessed portion 183a of the planarizing film 183 is formed in an area 1831f between the first bottom electrode layer 190a and the second bottom electrode layer 190b where the resist 502 is not formed (see FIG. 12C). In contrast to the manufacturing method pertaining to Embodiment 2, in the manufacturing method pertaining to Embodiment 3, at least a part of the side sub-surface 183s included in the surface of the planarizing film 183 in the recessed portion 183a is below the bottom electrode layer 190 by changing etching conditions (e.g. etching time).

In the manufacturing method pertaining to Embodiment 3, the method for forming the recessed portion 183a of the planarizing film 183 is not limited to the dry etching method. The recessed portion 183a may be formed by a wet etching method.

Figure 13A:
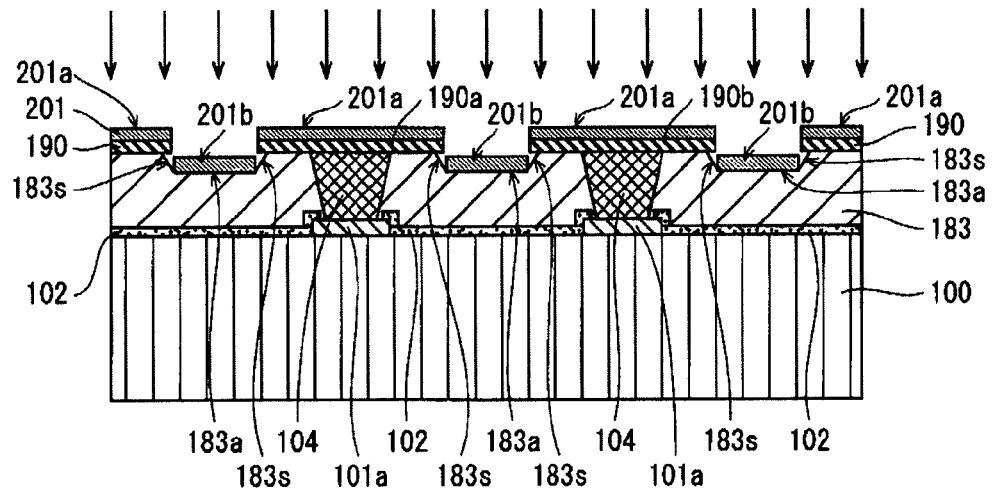
FIGS. 13A, 13B, and 13C are schematic end views showing a process of manufacturing the display panel 14.

Next, as shown in FIG. 13A, semiconductor materials are disposed on the bottom electrode layer 190 and the surface of the planarizing film 183 in the recessed portion 183a to form the semiconductor layer 201. The semiconductor layer 201 includes the semiconductor interlayer 201a formed on the bottom electrode layer 190 and the recessed portion filling layer 201b formed on the surface of the planarizing film 183 in the recessed portion 183a. Note that, as shown in FIG. 13A, since at least a part of the side sub-surface 183s included in the surface of the planarizing film 183 in the recessed portion 183a is below the bottom electrode layer 190, the semiconductor layer 201 is surely divided at the part in a state where the semiconductor materials are disposed.

Figure 13B:
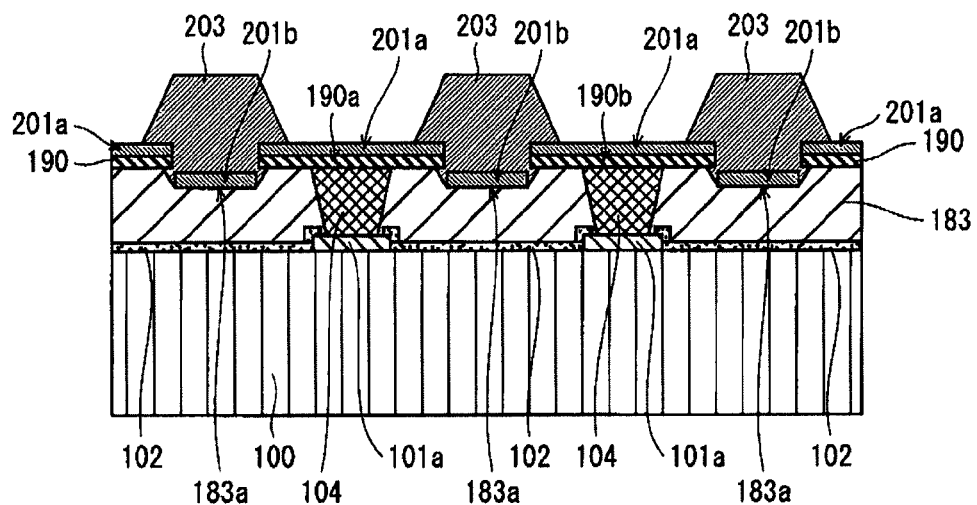

Next, an insulating material layer is formed, for example, by a spin coat method, on the semiconductor layer 201 to form the bank 203. The insulating material layer is patterned by being exposed and developed with use of a photomask. Then, as shown in FIG. 13B, the bank 203 is formed through a cleaning procedure using cleaning solution.

Figure 13C:
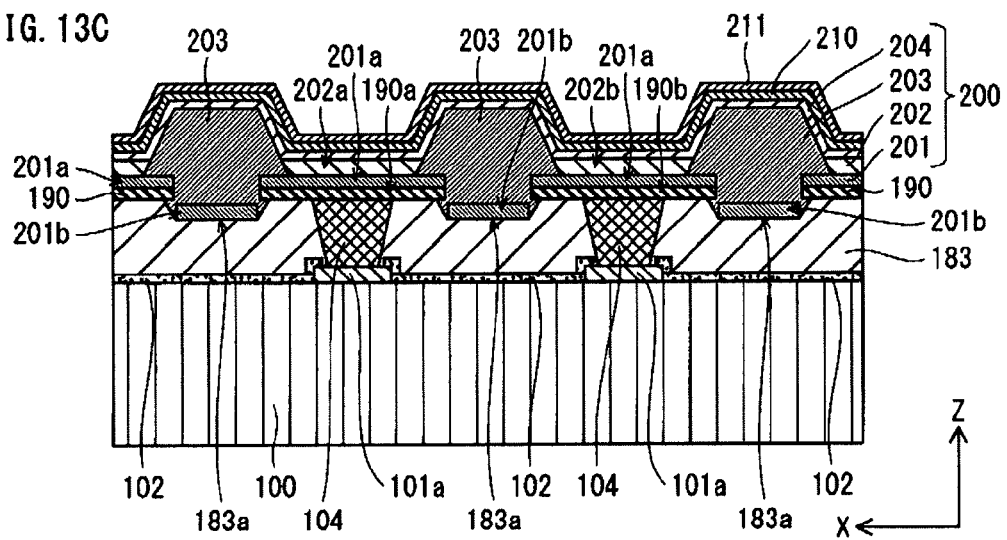

Next, as shown in FIG. 13C, an ink composition including a material of the light-emitting layer 202 is dropped, by an ink jet method, in areas divided by the bank 203 and dried to form the light-emitting layer 202. Furthermore, the electron-injection layer 204, the top electrode layer 210, and the passivation layer 211 are laminated on the light-emitting layer 202.

Similarly to the manufacturing methods pertaining to Embodiments 1 and 2, in addition to the ink jet method, the light-emitting layer 202 may be formed by a dispenser method, a nozzle coat method, a spin coat method, an intaglio printing method, a letterpress printing method, and the like. Furthermore, in order to dry the ink composition, drying in a vacuum and drying under a nitrogen atmosphere are performed in this order.

Similarly to the manufacturing methods pertaining to Embodiments 1 and 2, by way of examples, a vacuum deposition method can be used to form the electron-injection layer 204, and a plasma coating method can be used to form the top electrode layer 210.

Main parts of the display panel 14 are completed in the above-mentioned manner.

In the manufacturing method of the display panel 14 pertaining to Embodiment 3, as shown in FIG. 13A, the semiconductor layer 201 is formed in a state where the recessed portion 183a of the planarizing film 183 is formed in an area between the first bottom electrode layer 190a and the second bottom electrode layer 190b. With a shadowing effect, the surface of the planarizing film 183 in the recessed portion 183a includes a side sub-surface 183s, on a part of which the semiconductor layer 201 is not formed (see a circle outlined by a long dashed double-short dashed line in FIG. 11). Therefore, the semiconductor interlayer 201a formed on the first bottom electrode layer 190a and the recessed portion filling layer 201b adjacent to the semiconductor interlayer 201a are not electrically connected with each other. The same applies to the semiconductor interlayer 201a formed on the second bottom electrode layer 190b and the recessed portion filling layer 201b adjacent to the semiconductor interlayer 201a.

Note that, as described above, in Embodiment 3, since at least a part of the side sub-surface 183s included in the surface of the planarizing film 183 in the recessed portion 183a is below the bottom electrode layer 190, the semiconductor layer 201 is surely divided at the part.

Therefore, since the leak current is further prevented from flowing between the first bottom electrode layer 190a and the second bottom electrode layer 190b in the display panel 14 compared with cases of the display panels 10 and 12 pertaining to Embodiments 1 and 2, respectively, the crosstalk is not caused.

Figure 12C:
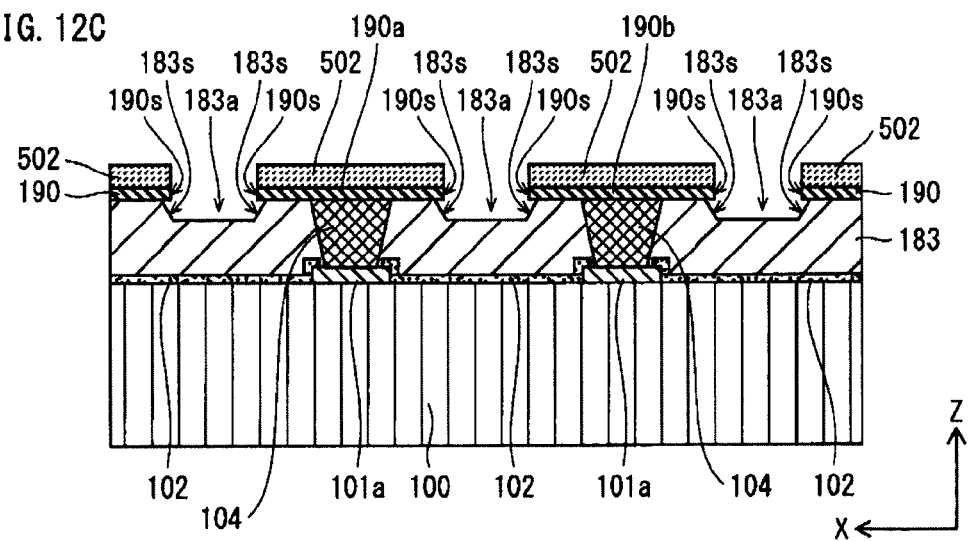

Furthermore, in the manufacturing method pertaining to Embodiment 3, as shown in FIGS. 12B and 12C, the resist 502 for forming the bottom electrode layer 190 is not removed even after the formation of the bottom electrode layer 190, and is used as a mask for forming the recessed portion 183a of the planarizing film 183. This structure eliminates the need for the use of a new mask to form the recessed portion 183a. The manufacturing procedures can be simplified, and thus it becomes possible to reduce the manufacturing costs.

Note that, in the display panel 14 pertaining to Embodiment 3, a shortest distance between (i) a lowest point on the surface of the planarizing film 183 in the recessed portion 183a and (ii) a point on an imaginary surface that coincides with the surface of the planarizing film 183 in the non-recessed portion is greater than the thickness of the recessed portion filling layer 201b formed on the surface of the planarizing film 183 in the recessed portion 183a (the thickness of the recessed portion filling layer 201b formed at a middle of the recessed portion 183a). This is to allow the recessed portion filling layers 201b to be completely separated from the semiconductor interlayer 201a and the bottom electrode layer 190.

Embodiment 4

1. Structure of Display Panel 16

An organic EL display device pertaining to Embodiment 4 has the structure similar to the structure of the organic EL display device 1 pertaining to Embodiments 1, 2, and 3 except for the structure of a display panel 16. The following describes the structure of the display panel 16 with use of FIG. 14.

Figure 14:
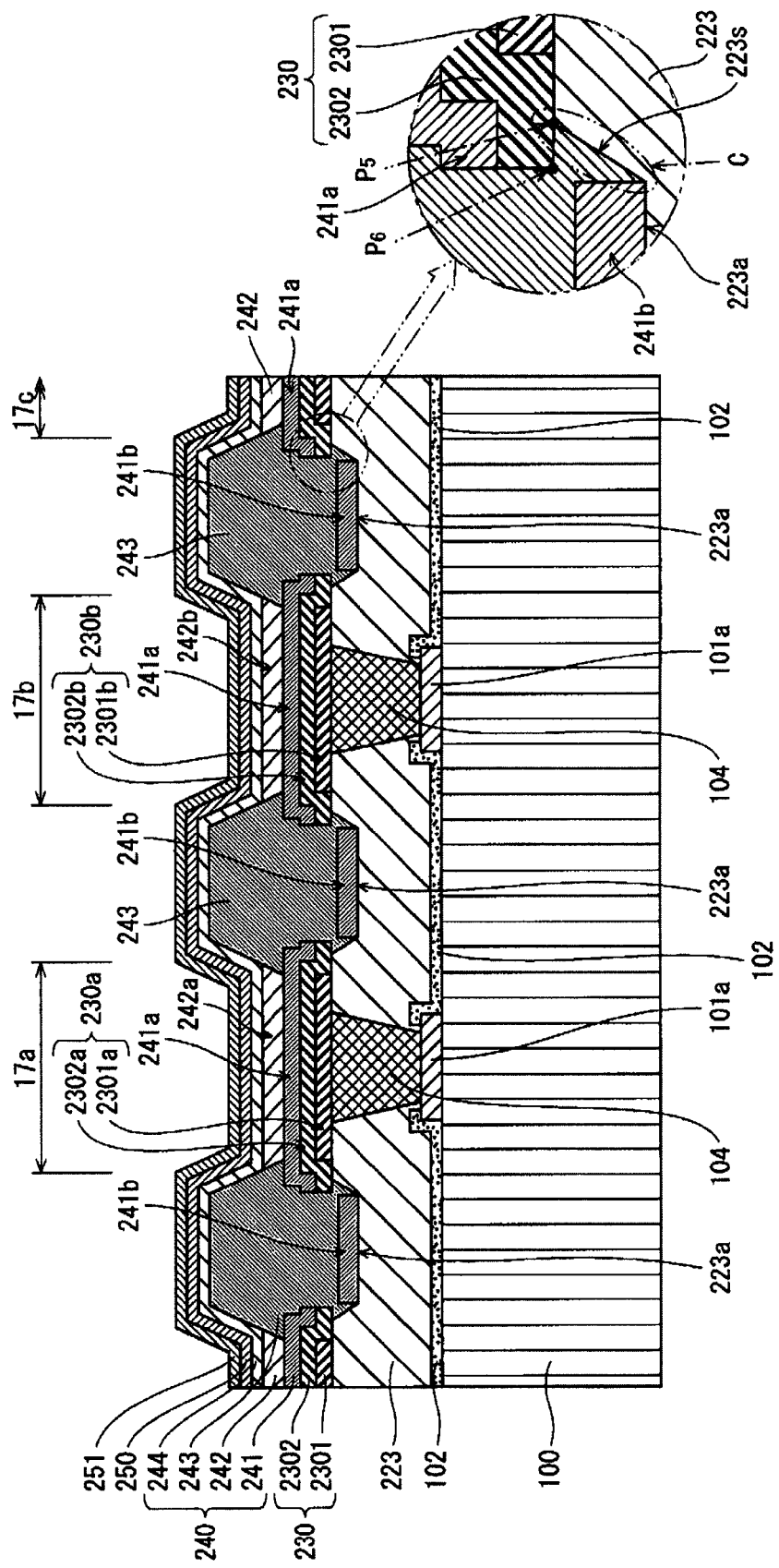
FIG. 14 is a schematic end view showing a part of the structure of a display panel 16 of an organic EL display device pertaining to Embodiment 4.

As shown in FIG. 14, the display panel 16 pertaining to Embodiment 4 is a top-emission type organic EL display panel that includes an array of sub-pixels 17a, 17b, and 17c each having an organic light-emitting layer of any one of luminescent colors: red (R), green (G), and blue (B).

The TFT layer (in FIG. 14, only sources 101a, parts of the TFT layer, are illustrated) and the passivation film 102 that are formed on the substrate 100, and the contact holes 104 formed in a planarizing film 223 have the same structure as those included in the display panels 10 and 12 pertaining to Embodiments 1 and 2, respectively.

As shown in FIG. 14, in the display panel 16, the planarizing film 223 has a recessed portion 223a in an area between adjacent bottom electrode layers (i.e. anode layers) 230. Then, a semiconductor layer 241 is formed on the bottom electrode layer 230. The semiconductor layer 241 includes (i) a semiconductor interlayer 241a that functions as a hole-injection layer and/or a hole-transporting layer, and (ii) a recessed portion filling layer 241b that is formed on a surface of the planarizing film 223 in the recessed portion 223a and is made of the same material as the semiconductor interlayer 241a.

Here, in the display panel 16 pertaining to Embodiment 4, the bottom electrode layer 230 has a laminated structure in which a metal layer 2301 and a transparent conductive layer 2302 are laminated. A first bottom electrode layer 230a for a sub-pixel 17a has a laminated structure in which a first metal layer 2301a and a first transparent conductive layer 2302a are laminated. Similarly, a second bottom electrode layer 230b for a sub-pixel 17b has a laminated structure in which a second metal layer 2301b and a second transparent conductive layer 2302b are laminated.

As shown in FIG. 14, a light-emitting layer 242, an electron-injection layer 244, a top electrode layer (cathode layer) 250, and a passivation layer 251 are laminated on the semiconductor interlayer 241a in the stated order. A bank 243 for dividing the light-emitting layer 242 into parts for respective sub-pixels 17a, 17b, and 17c is formed. The semiconductor interlayer 241a, the light-emitting layer 242, the bank 243, and the electron-injection layer 244 constitute a light-emitting layered body 240 as a whole. Similarly to the light-emitting layers 122, 162, and 202 in the display panels 10, 12, and 14 pertaining to Embodiments 1, 2, and 3, respectively, the light-emitting layer 242 includes (i) a first light-emitting layer 242a formed above a first transparent conductive layer 2302a in the first bottom electrode layer 230a and (ii) a second light-emitting layer 242b formed above a second transparent conductive layer 2302b in the second bottom electrode layer 230b.

The bank 243 in the display panel 16 pertaining to Embodiment 4 also has the so-called "pixel bank" structure.

2. Recessed Portion 223a of Planarizing Film 223 and Semiconductor Layer 241

As shown in FIG. 14, in the display panel 16 pertaining to Embodiment 4, the planarizing film 223 has the recessed portion 223a in an area between the first bottom electrode layer 230a and the second bottom electrode layer 230b. The display panel 16 is similar to the display panels 10, 12, and 14 pertaining to Embodiments 1, 2, and 3, respectively, in that the surface of the planarizing film 223 is lower in the recessed portion 223a than in a non-recessed portion. Furthermore, the display panel 16 is similar to the display panels 10, 12, and 14 pertaining to Embodiments 1, 2, and 3, respectively, in that the recessed portion filling layer 241b is formed on the surface of the planarizing film 223 in the recessed portion 223a.

As shown in a circle outlined by a long dashed double-short dashed line in FIG. 14, in the display panel 16 pertaining to Embodiment 4, the bottom electrode layer 230 overhangs the recessed portion 223a of the planarizing film 223 so that a verge of an opening (a point $P_5$) of the recessed portion 223a is at a position that is set back from an edge (a point $P_6$) of the transparent conductive layer 2302 in the bottom electrode layer 230. Note that, in the bottom electrode layer 230, edges of the metal layer 2301 are covered with the transparent conductive layer 2302.

With the above-mentioned structure, in the display panel 16 pertaining to Embodiment 4, since the surface of the planarizing film 223 in the recessed portion 223a includes a side sub-surface 223s, on a part of which the semiconductor layer 241 is not formed (i.e. the part located below the transparent conductive layer 2302 in the bottom electrode layer 230 indicated by an arrow C), the semiconductor interlayer 241a formed on the first bottom electrode layer 230a and the semiconductor interlayer 241a formed on the second bottom electrode layer 230b are separated from each other by the part.

With this structure, the semiconductor interlayers 241a for respective sub-pixels 17a, 17b, and 17c are not continuously formed beyond the recessed portion 223a. Therefore, in the display panel 16, since the first bottom electrode layer 230a and the second bottom electrode layer 230b are not electrically connected with each other by the semiconductor layer 241, the leak current is prevented from flowing between the first bottom electrode layer 230a and the second bottom electrode layer 230b. In Embodiment 4, at least a part of the recessed portion 223a is below the transparent conductive layer 2302 in the bottom electrode layer 230, and the semiconductor layer 241 is divided at the part. Therefore, the leak current is further prevented from flowing between the first bottom electrode layer 230a and the second bottom electrode layer 230b as in the case of the display panel 14 pertaining to Embodiment 3.

Accordingly, the display panel 16 pertaining to Embodiment 4 can prevent the occurrence of the crosstalk.

In addition, as shown in FIG. 14, in the display panel 16 pertaining to Embodiment 4, since the bank 243 is embedded in the recessed portion 223a of the planarizing film 223, it becomes difficult for the bank 243 to be detached. Therefore, the organic EL display device pertaining to Embodiment 4 is highly reliable.

3. Manufacturing Method of Display Panel 16

The following describes the manufacturing method of the display panel 16 with use of FIGS. 15A to 17B. In FIGS. 15A to 17B, parts of the display panel 16 are shown schematically.

Figure 15A:
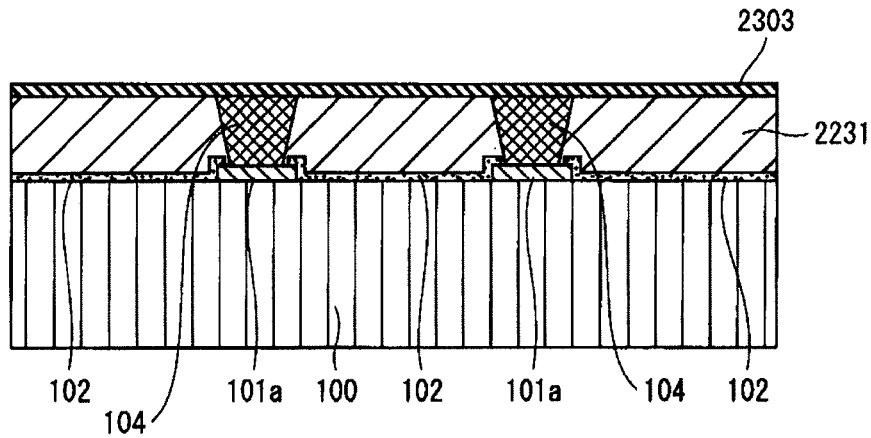
FIGS. 15A, 15B, and 15C are schematic end views showing a process of manufacturing the display panel 16.

First, as shown in FIG. 15A, by performing the steps shown in FIGS. 5A to 5C in Embodiment 1, the TFT layer (in FIG. 15A, only sources 101a, parts of the TFT layer, are illustrated), the passivation film 102, and a planarizing film 2231 are formed on the substrate 100, the contact hole 104 is formed in the planarizing film 2231, and a metal film 2303 is formed on the planarizing film 2231.

Figure 15B:
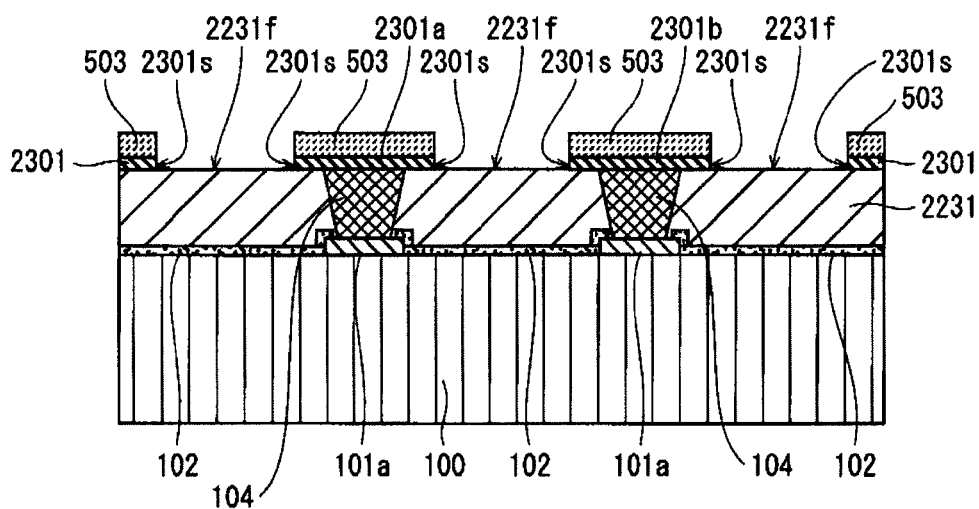

Next, as shown in FIG. 15B, photosensitive resists 503 are deposited on the metal film 2303 in areas where the metal layer 2301 in the bottom electrode layer 230 is to be formed. Then, as shown in FIG. 15B, the metal film 2303 is patterned by a photolithography method and an etching method to form the metal layer 2301 in the first bottom electrode layer 230 including (i) a metal layer 2301a in the first bottom electrode layer 230a and (ii) the metal layer 2301b in the second bottom electrode layer 230b. Note that, in the manufacturing method pertaining to Embodiment 4, as shown in FIG. 15B, edges 2301s of the metal layer 2301 in the bottom electrode layer 230 match edges of the resist 503 after the etching process.

Figure 15C:
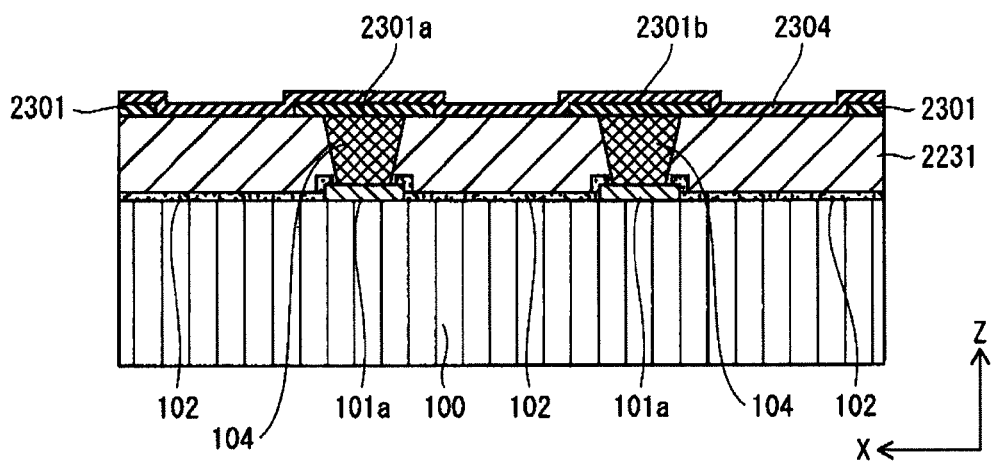

Next, in contrast to the manufacturing methods pertaining to Embodiments 1, 2, and 3, the resist 503 is removed from the metal layer 2301 in the bottom electrode layer 230. Then, as shown in FIG. 15C, a transparent conductive film 2304 is formed so as to cover the metal layer 2301 and an exposed surface 2231f of the planarizing film 2231 positioned between the adjacent metal layers 2301. The transparent conductive film 2304 can be formed, for example, by a sputtering method.

Figure 16A:
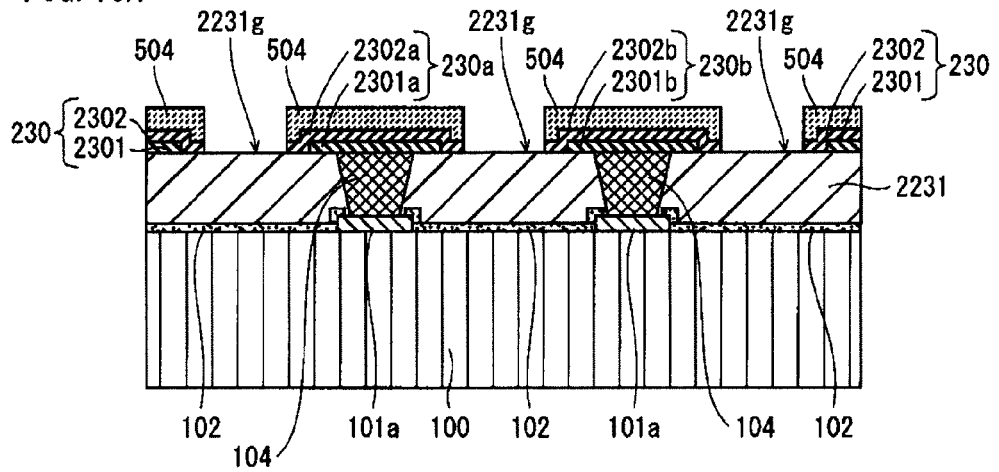
FIGS. 16A, 16B, and 16C are schematic end views showing a process of manufacturing the display panel 16.

Next, as shown in FIG. 16A, photosensitive resists 504 are deposited on the transparent conductive film 2304 in areas where the transparent conductive layer 2302 in the bottom electrode layer 230 is to be formed. By performing an etching (e.g. wet etching) processing to the transparent conductive film 2304 in this state, the transparent conductive layer 2302 including the transparent conductive layer 2302a and the transparent conductive layer 2302b is patterned. The bottom electrode layer 230 including the first bottom electrode layer 230a and the second bottom electrode layer 230b is formed in the above-mentioned manner.

Next, after the resist 504 is removed, etching (e.g. dry etching) processing is performed by using the transparent conductive layer 2302 in the bottom electrode layer 230 as a mask. Thus, the recessed portion 223a of the planarizing film 223 is formed in an area 2231g between the first bottom electrode layer 230a and the second bottom electrode layer 230b (see FIG. 16B). Similarly to the manufacturing method pertaining to Embodiment 3, in the manufacturing method pertaining to Embodiment 4, at least a part of the side sub-surface 223s included in the surface of the planarizing film 223 in the recessed portion 223a is below the transparent conductive layer 2302 in the bottom electrode layer 230 by changing etching conditions (e.g. etching time).

In the manufacturing method pertaining to Embodiment 4, the method for forming the recessed portion 223a of the planarizing film 223 is not limited to the dry etching method. The recessed portion 223a may be formed by a wet etching method.

Figure 16B:
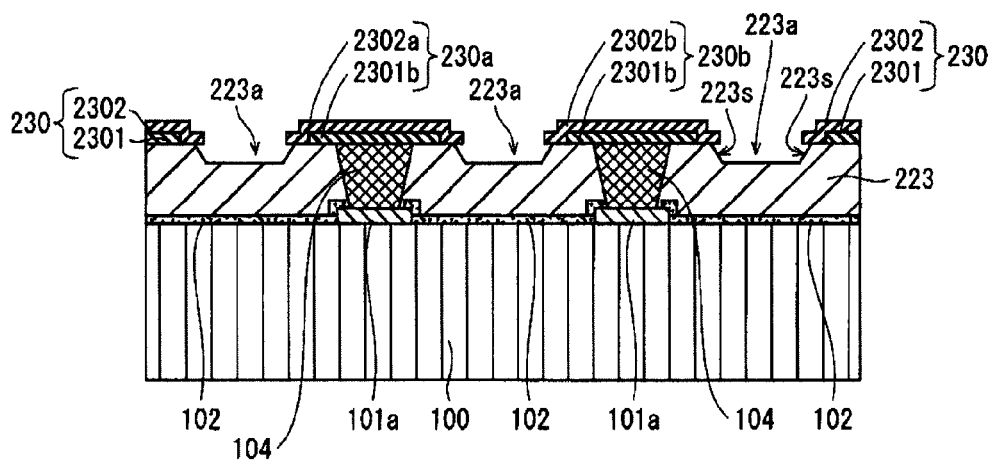
Figure 16C:
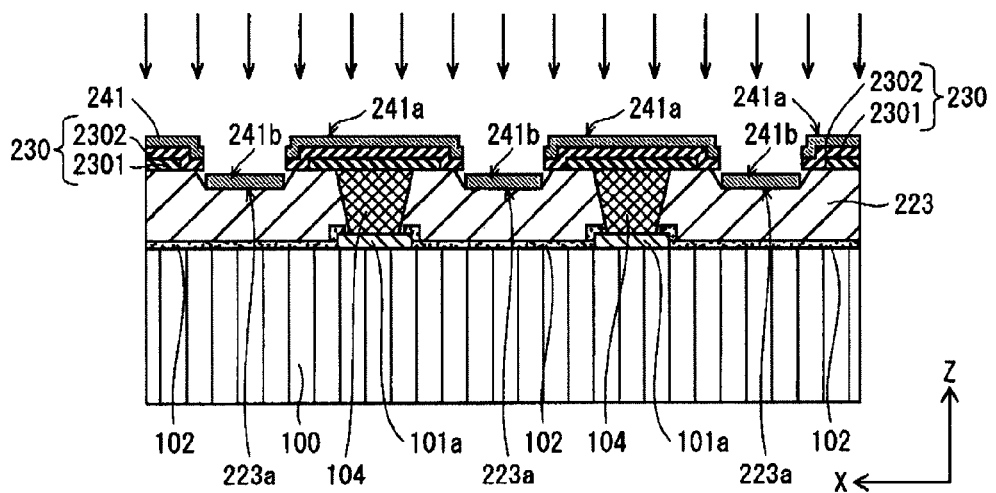

Next, as shown in FIG. 16C, semiconductor materials are disposed on the transparent conductive layer 2302 in the bottom electrode layer 230 and the surface of the planarizing film 223 in the recessed portion 223a to form the semiconductor layer 241. The semiconductor layer 241 includes the semiconductor interlayer 241a formed on the transparent conductive layer 2302 in the bottom electrode layer 230 and the recessed portion filling layer 241b formed on the surface of the planarizing film 223 in the recessed portion 223a. Note that, as shown in FIG. 16C, since at least a part of the side sub-surface 223s included in the surface of the planarizing film 223 in the recessed portion 223a is below the transparent conductive layer 2302 in the bottom electrode layer 230, the semiconductor layer 241 is surely divided at the part in a state where the semiconductor materials are disposed.

Figure 17A:
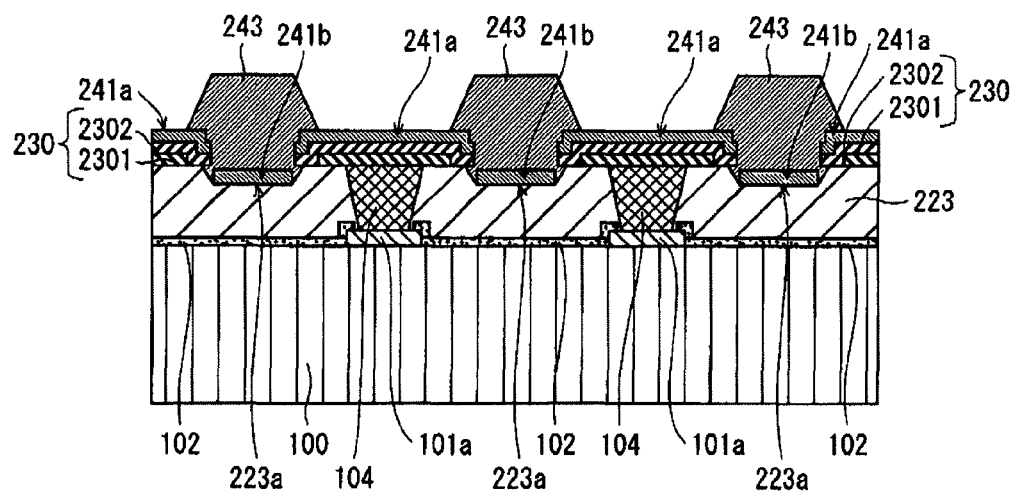
FIGS. 17A, and 17B are schematic end views showing a process of manufacturing the display panel 16.

Next, an insulating material layer is formed, for example, by a spin coat method, on the semiconductor layer 241 to form the bank 243. The insulating material layer is patterned by being exposed and developed with use of a photomask. Then, as shown in FIG. 17A, the bank 243 is formed through a cleaning procedure using cleaning solution.

Figure 17B:
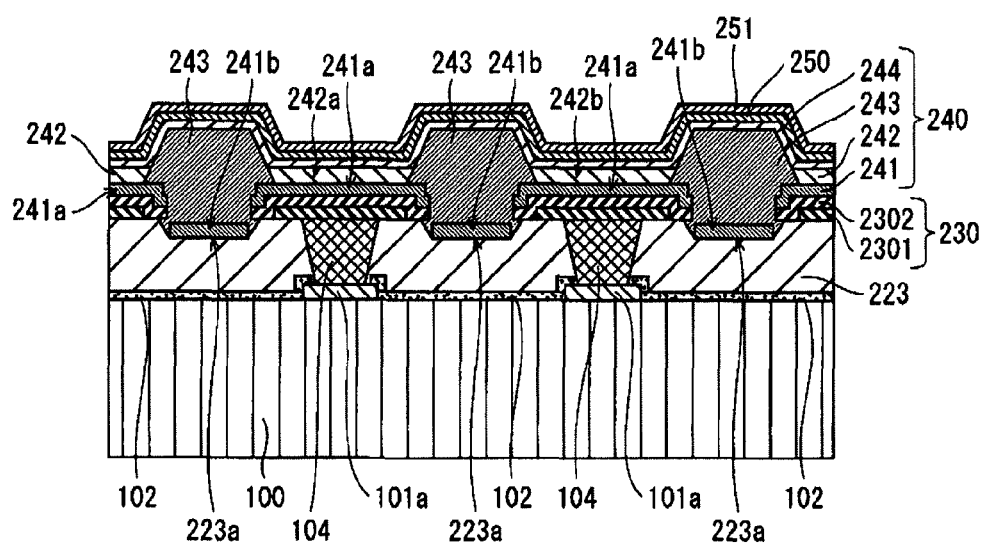

Next, as shown in FIG. 17B, an ink composition including a material of the light-emitting layer 242 is dropped, by an ink jet method, in areas divided by the bank 243 and dried to form the light-emitting layer 242. Furthermore, the electron-injection layer 244, the top electrode layer 250, and the passivation layer 251 are laminated on the light-emitting layer 242.

Similarly to the manufacturing methods pertaining to Embodiments 1, 2, and 3, in addition to the ink jet method, the light-emitting layer 242 may be formed by a dispenser method, a nozzle coat method, a spin coat method, an intaglio printing method, a letterpress printing method, and the like. Furthermore, in order to dry the ink composition, drying in a vacuum and drying under a nitrogen atmosphere are performed in this order.

Similarly to the manufacturing methods pertaining to Embodiments 1, 2, and 3, by way of examples, a vacuum deposition method can be used to form the electron-injection layer 244, and a plasma coating method can be used to form the top electrode layer 250.

Main parts of the display panel 16 are completed in the above-mentioned manner.

In the manufacturing method of the display panel 16 pertaining to Embodiment 4, as shown in FIG. 16C, the semiconductor layer 241 is formed in a state where the recessed portion 223a of the planarizing film 223 is formed in an area between the first bottom electrode layer 230a and the second bottom electrode layer 230b. With a shadowing effect, the surface of the planarizing film 223 in the recessed portion 223a includes a side sub-surface 223s, on a part of which the semiconductor layer 241 is not formed (see a circle outlined by a long dashed double-short dashed line in FIG. 14). Therefore, the semiconductor interlayer 241a formed on the first bottom electrode layer 230a and the recessed portion filling layer 241b adjacent to the semiconductor interlayer 241a are not electrically connected with each other. The same applies to the semiconductor interlayer 241a formed on the second bottom electrode layer 230b and the recessed portion filling layer 241b adjacent to the semiconductor interlayer 241a.

Note that, as described above, in Embodiment 4, since at least a part of the side sub-surface 223s included in the surface of the planarizing film 223 in the recessed portion 223a is below the transparent conductive layer 2302 in the bottom electrode layer 230, the semiconductor layer 241 is surely divided at the part.

Therefore, in the display panel 16, similarly to the display panel 14 pertaining to Embodiment 3, since the leak current is further prevented from flowing between the first bottom electrode layer 230a and the second bottom electrode layer 230b, the crosstalk is not caused.

Furthermore, in the manufacturing method pertaining to Embodiment 4, as shown in FIGS. 16A and 16B, the transparent conductive layer 2302 in the bottom electrode layer 230 is used as a mask for forming the recessed portion 223a of the planarizing film 223. This structure eliminates the need for the use of a new mask to form the recessed portion 223a. The manufacturing procedures can be simplified, and thus it becomes possible to reduce the manufacturing costs.

Note that, in the display panel 16 pertaining to Embodiment 4, a shortest distance between (i) a lowest point on the surface of the planarizing film 223 in the recessed portion 223a and (ii) a point on an imaginary surface that coincides with the surface of the planarizing film 223 in the non-recessed portion is greater than the thickness of the recessed portion filling layer 241b formed on the surface of the planarizing film 223 in the recessed portion 223a (the thickness of the recessed portion filling layer 241b formed at a middle of the recessed portion 223a). This is to allow the recessed portion filling layers 241b to be completely separated from the semiconductor interlayer 241a and the bottom electrode layer 230.

Other Embodiments

Figure 18:
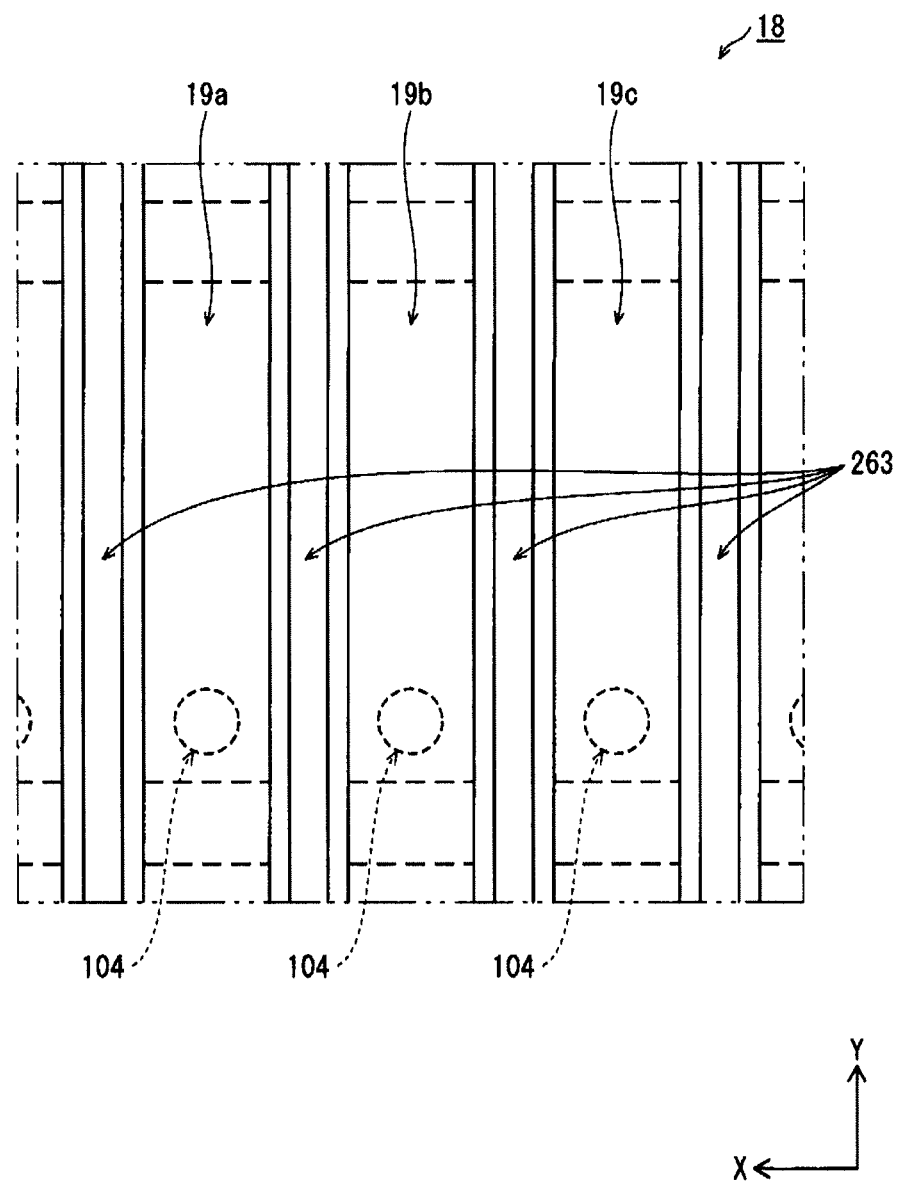
FIG. 18 is a schematic plan view showing a bank 263 of a display panel 18 pertaining to Modification.
Figure 19:
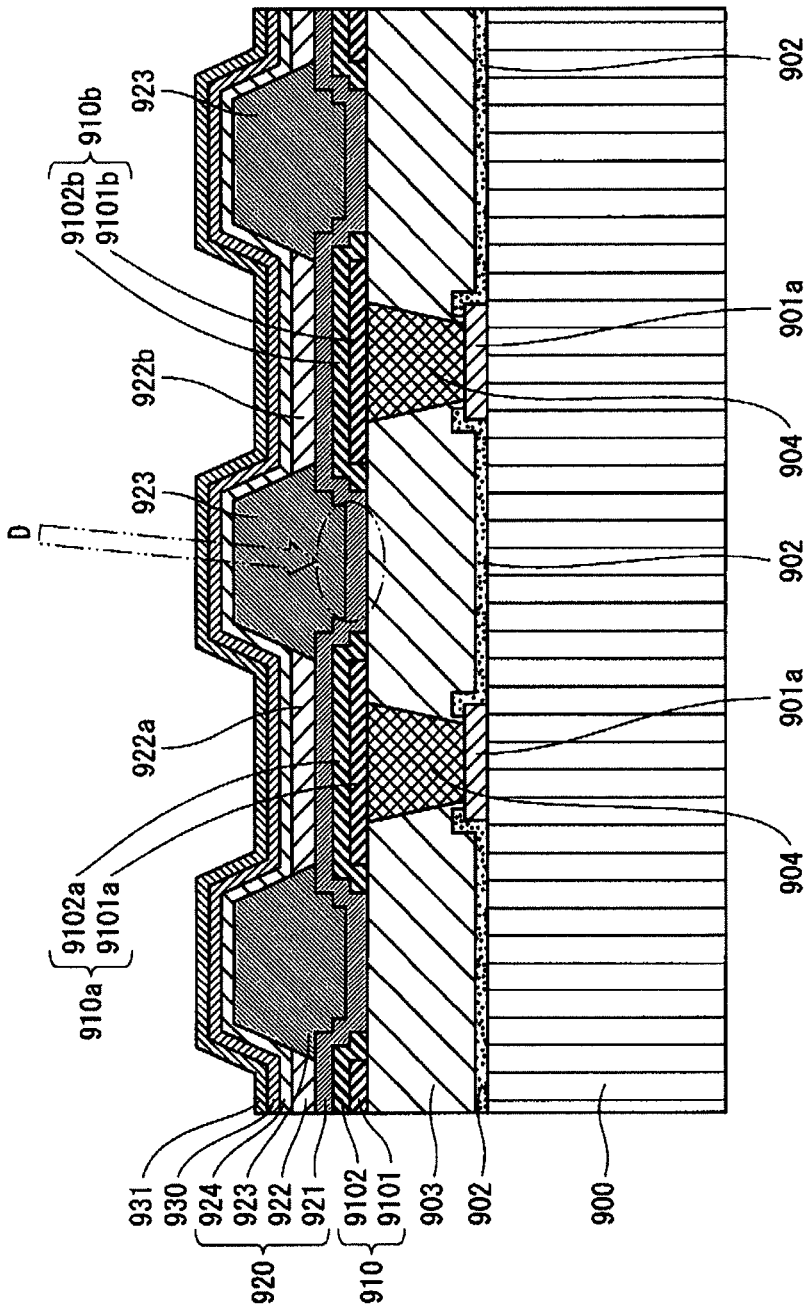
FIG. 19 is a schematic end view showing a part of the structure of a display panel relating to conventional technology.

In the above-mentioned Embodiments 1, 2, 3, and 4, the banks 123, 163, 203, and 243 have the so-called "pixel bank" structures. The structures, however, are not limited to the so-called "pixel bank" structures. As shown in FIG. 18, for example, a bank 263 having a so-called "line bank" structure may be adopted, and light-emitting layers for sub-pixels 19a, 19b, and 19c arranged in an X direction may be separated from one another by the bank 263.

In the above-mentioned Embodiments 1, 2, 3, and 4, the organic EL display devices 1 are adopted as examples of the light-emitting device. The light-emitting device, however, is not limited to the organic EL device. The light-emitting device may be applied, for example, to a lighting device.

Furthermore, the structure of the bottom electrode layer 230 pertaining to Embodiment 4 may be applied to the bottom electrode layers 110 and 150 pertaining to Embodiments 1 and 2, respectively.

In the above-mentioned Embodiments 1, 2, 3, and 4, the bottom electrode layers 110, 150, 190, 230 are anode layers, whereas the top electrode layers 130, 170, 210, and 250 are cathode layers. The anode and cathode layers, however, may be reversed.

In the above-mentioned Embodiments 1, 2, 3, and 4, although a top-emission type organic EL display device is adopted, a bottom-emission type organic EL display device may be adopted.

Forms and sizes of the recessed portions 103a, 143a, 183a, and 223a of the planarizing film 103, 143, 183, and 223, respectively, are not limited to those indicated in the attached drawings. For example, the shortest distance between (i) the lowest point on the surface of the planarizing film in the recessed portion and (ii) the point on the imaginary surface that coincides with the surface of the planarizing film in the non-recessed portion may be increased to further prevent the leak current from flowing between the bottom electrode layers within the technologically possible limits.

INDUSTRIAL APPLICABILITY

The present invention is useful to realize a light-emitting device that does not cause the crosstalk and has high light-emitting performance.

What is claimed is:
1. A light-emitting device, comprising:
   a substrate;
   a planarizing film above the substrate, the planarizing film having a planarizing film recessed portion between planarizing film non-recessed portions, the planarizing film recessed portion being recessed from the planarizing film non-recessed portions;
   a bottom electrode layer above the planarizing film non-recessed portions, whereby the planarizing film recessed portion is between and offset from the bottom electrode layer on each of the planarizing film non-recessed portions;
   a semiconductor interlayer above the bottom electrode layer;
   a filling layer above the planarizing film recessed portion, the filling layer comprising a same material as the semiconductor layer and having a filling layer inner portion between filling layer outer portions; and
   a bank above the planarizing film recessed portion and edge portions of the bottom electrode layer, each of the edge portions of the bottom electrode layer neighboring the planarizing film recessed portion,
   wherein the filling layer inner portion has a thickness of t1, the filling layer outer portions have a thickness of t2, and t1 is greater than t2, and
   a smallest depth of the planarizing film recessed portion is greater than the thickness of t1 of the filling layer inner portion.
2. The light-emitting device according to claim 1, wherein the bottom electrode layer includes a transparent conductive layer at a side proximate to the semiconductor interlayer, and
   the semiconductor interlayer is on the transparent conductive layer.
3. The light-emitting device according to claim 1, further comprising:
   a thin film transistor layer between the substrate and the planarizing film,
   wherein the planarizing film is on the thin film transistor layer.
4. The light-emitting device according to claim 1, further comprising:
   a light-emitting layer above the bottom electrode layer and on the semiconductor interlayer,
   wherein the bank separates the light-emitting layer.
5. The light-emitting device according to claim 4, further comprising:
   a top electrode layer above the light-emitting layer.
6. The light-emitting device according to claim 5, wherein the top electrode layer comprises a cathode layer.
7. The light-emitting device according to claim 1, wherein the bottom electrode layer comprises an anode layer, and the semiconductor interlayer comprises a hole-injection layer.
8. A light-emitting device, comprising:
   a substrate;
   a planarizing film above the substrate, the planarizing film having a planarizing film recessed portion between planarizing film non-recessed portions, the planarizing film recessed portion being recessed from the planarizing film non-recessed portions;
   a bottom electrode layer above the planarizing film non-recessed portions, whereby the planarizing film recessed portion is between and offset from the bottom electrode layer on each of the planarizing film non-recessed portions;
   a semiconductor interlayer above the bottom electrode layer;
   a filling layer above the planarizing film recessed portion, the filling layer comprising a same material as the semiconductor layer and having a filling layer inner portion between filling layer outer portions; and
   a bank above the planarizing film recessed portion and edge portions of the bottom electrode layer, each of the edge portions of the bottom electrode layer neighboring the planarizing film recessed portion,
   wherein the planarizing film recessed portion includes side portions,
   the filling layer is not above parts of the side portions,
   the filling layer and the semiconductor interlayer are separated from each other by the parts of the side portions above which the filling layer is not,
   the filling layer inner portion has a first thickness, the filling layer outer portions have a second thickness, and the first thickness is greater than the second thickness, and
   a smallest depth of the planarizing film recessed portion is greater than the first thickness of the filling layer inner portion.
9. The light-emitting device according to claim 8, wherein a verge of an opening of the planarizing film recessed portion is under the bottom electrode layer.
10. The light-emitting device according to claim 8, wherein the bottom electrode layer includes a transparent conductive layer at a side proximate to the semiconductor interlayer, and
    the semiconductor interlayer is on the transparent conductive layer.
11. The light-emitting device according to claim 8, further comprising:
    a thin film transistor layer between the substrate and the planarizing film,
    wherein the planarizing film is on the thin film transistor layer.
12. The light-emitting device according to claim 8, further comprising:
    a light-emitting layer above the bottom electrode layer and on the semiconductor interlayer,
    wherein the bank separates the light-emitting layer.
13. The light-emitting device according to claim 12, further comprising:
    a top electrode layer above the light-emitting layer.
14. The light-emitting device according to claim 13, wherein the top electrode layer comprises a cathode layer.
15. The light-emitting device according to claim 8, wherein the bottom electrode layer comprises an anode layer, and the semiconductor interlayer comprises a hole-injection layer.
16. The light-emitting device according to claim 1, wherein the filling layer inner portion extends from one of the filling layer outer portions to an other of the filling layer outer portions.

* * * * *